(12) United States Patent
Oka et al.

(10) Patent No.: US 7,360,927 B2
(45) Date of Patent: Apr. 22, 2008

(54) ELECTRONIC APPARATUS AND LIGHTING DEVICE

(75) Inventors: Shigeharu Oka, Numazu (JP); Kenichi Kohari, Mishima (JP); Tsutomu Araki, Fujisawa (JP); Koji Suzuki, Numazu (JP); Kiyoteru Kosa, Numazu (JP); Daisuke Ogino, Mishima (JP); Shinichi Karasawa, Numazu (JP)

(73) Assignee: Toshiba Lighting & Technology Corporation, Tokyo (JP)

( * ) Notice: Subject to any disclaimer, the term of this patent is extended or adjusted under 35 U.S.C. 154(b) by 96 days.

(21) Appl. No.: 11/201,199

(22) Filed: Aug. 11, 2005

(65) Prior Publication Data

US 2006/0034056 A1 Feb. 16, 2006

(30) Foreign Application Priority Data

| Aug. 11, 2004 | (JP) | ............................ 2004-234769 |
| Aug. 11, 2004 | (JP) | ............................ 2004-234770 |
| Oct. 15, 2004 | (JP) | ............................ 2004-300931 |
| Jun. 9, 2005 | (JP) | ............................ 2005-169855 |
| Jun. 9, 2005 | (JP) | ............................ 2005-169856 |

(51) Int. Cl.
*F21K 00/00* (2006.01)

(52) U.S. Cl. ...................................... 362/265; 439/936
(58) Field of Classification Search .................... None
See application file for complete search history.

(56) References Cited

U.S. PATENT DOCUMENTS

| 3,851,225 | A | * | 11/1974 | Luchetta ..................... 361/674 |
| 4,514,713 | A | | 4/1985 | van Dam | |
| 5,126,075 | A | * | 6/1992 | Nakagawa .................. 252/511 |
| 2006/0028830 | A1 | * | 2/2006 | Tsai ........................... 362/509 |

FOREIGN PATENT DOCUMENTS

JP    2003-7122    1/2003

* cited by examiner

*Primary Examiner*—Sharon E. Payne
*Assistant Examiner*—Kristen A Manskar
(74) *Attorney, Agent, or Firm*—DLA Piper US LLP

(57) ABSTRACT

There is disclosed an electronic apparatus which comprises a circuit module, a tray, and a filling material. The module comprises an electric insulating circuit board, and a plurality of electric components mounted on the board. The tray houses the module. The tray includes a raised bottom formed to project toward the circuit board. The filling material has waterproof properties and electric insulation. The circuit board and the electric components are buried to fill the tray with the filling material.

9 Claims, 25 Drawing Sheets

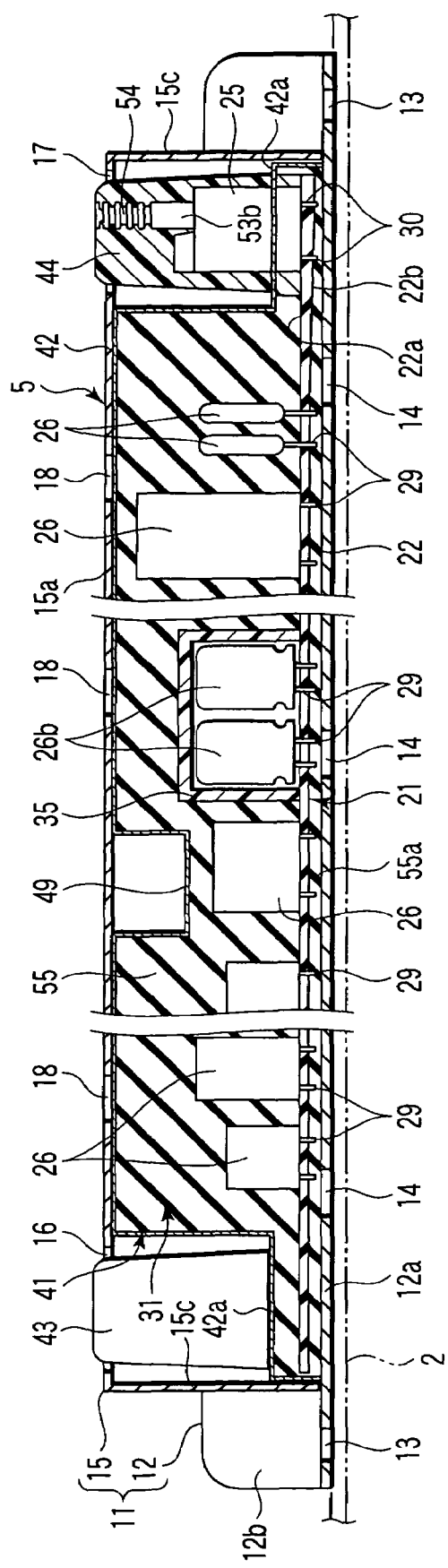
F I G. 4

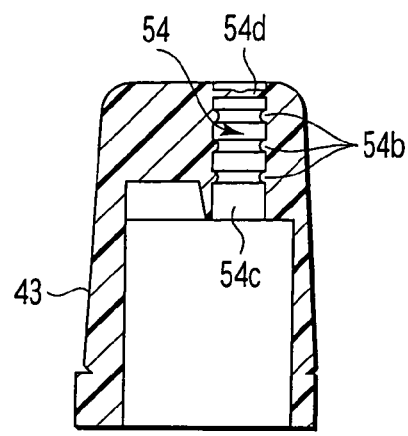
F I G. 20
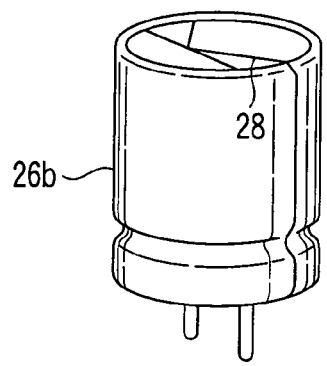
F I G. 21
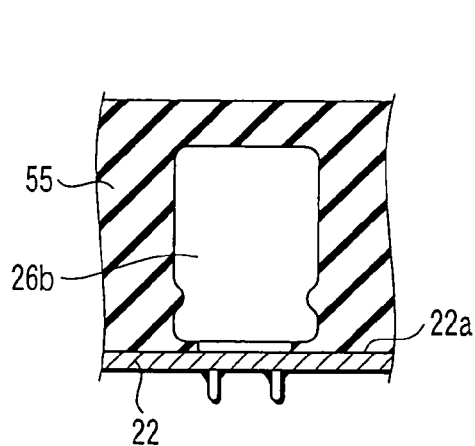 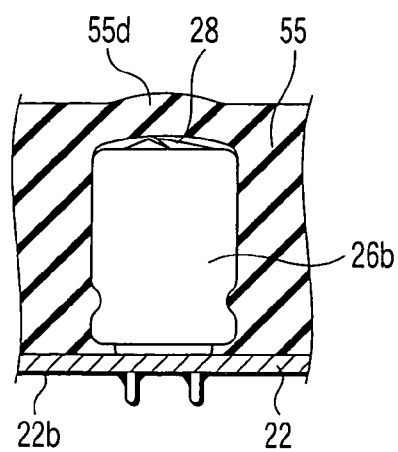
F I G. 22A         F I G. 22B

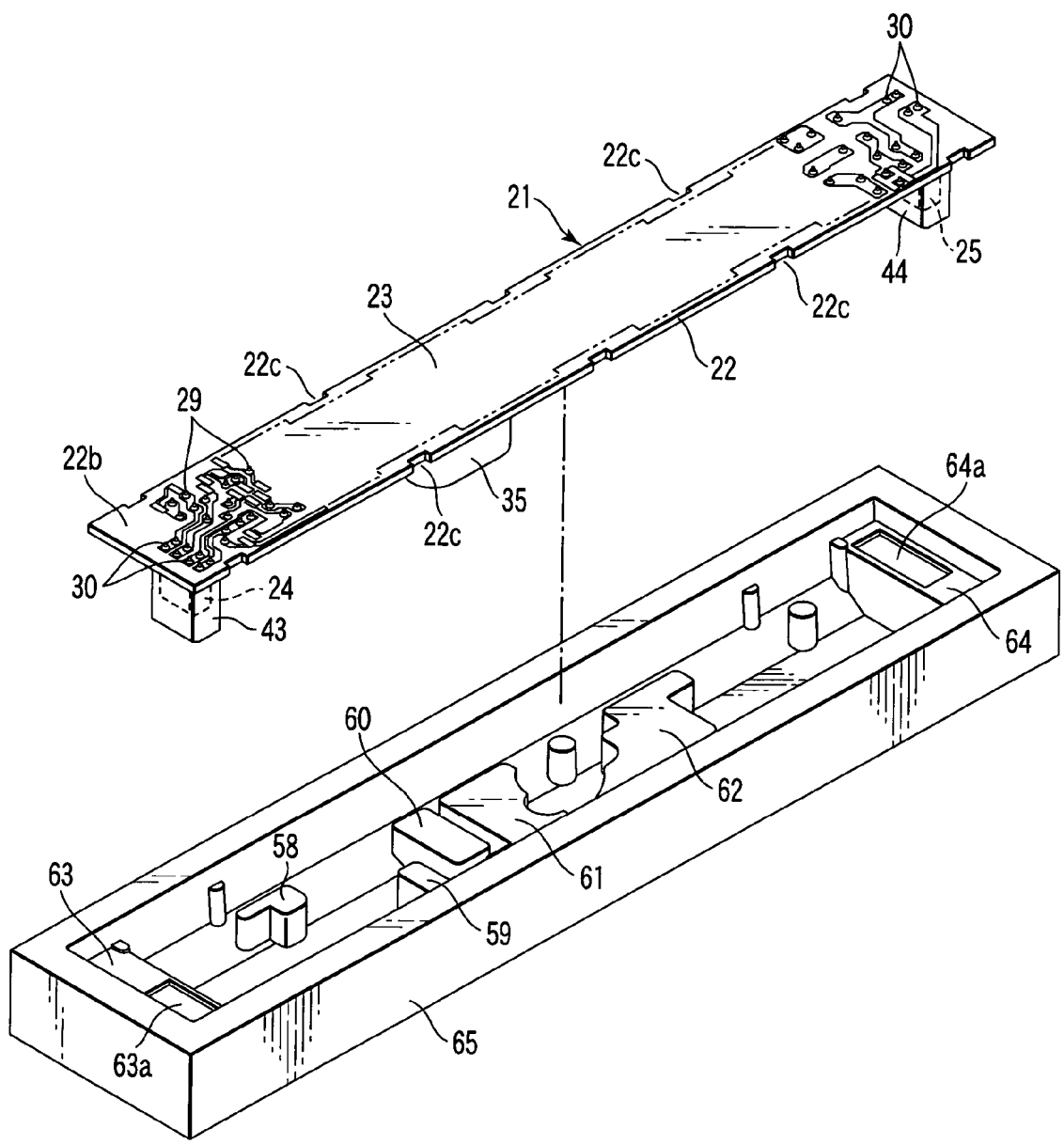
F I G. 32

ELECTRONIC APPARATUS AND LIGHTING DEVICE

CROSS-REFERENCE TO RELATED APPLICATIONS

This application is based upon and claims the benefit of priority from prior Japanese Patent Applications No. 2004-234769, filed Aug. 11, 2004; No. 2004-234770, filed Aug. 11, 2004; No. 2004-300931, filed Oct. 15, 2004; No. 2005-169855, filed Jun. 9, 2005; and No. 2005-169856, filed Jun. 9, 2005, the entire contents of all of which are incorporated herein by reference.

BACKGROUND OF THE INVENTION

1. Field of the Invention

The present invention relates to a waterproof electronic apparatus, and a lighting device which comprises the electronic apparatus to light a discharge lamp.

2. Description of the Related Art

There is a luminaire installed outdoors or under a highly humid environment. A lighting device that lights a discharge lamp disposed in the luminaire of this purpose may be exposed to high humidity. Accordingly, waterproof properties are required of the lighting device.

For the lighting device, an inverter controlled lighting device has frequency been used. The inverter controlled lighting device is an electronic apparatus, and configured by mounting a plurality of electric components a electric wire connector on a printed circuit board.

For example, a technology of improving waterproof properties of the inverter controlled lighting device by using a waterproof case is disclosed in Jpn. Pat. Appln. KOKAI Publication No. 2003-7122. The waterproof case described in the Publication comprises a cylindrical housing case and a side plate. The side plate seals both-end openings of the cylindrical housing case constituted of integrally molded articles of no seams in section. The waterproof case houses the inverter controlled lighting device.

In other words, the inverter controlled lighting device itself is assembled by comprising a case which constitutes its shell. This lighting device is housed in the waterproof case.

Accordingly, the waterproof case constituting the shell of the entire lighting device is large. Besides, in addition to time and labor of assembling the inverter controlled lighting device, the followings are necessary: time and labor of housing the lighting device in the cylindrical housing case, and time and labor of subsequently attaching the side plate to the housing case to assemble the waterproof case. Thus, the number of assembling steps of the lighting device is large.

In consequence, use of the large waterproof case leads to a cost increase. Besides, assembling is costly, and thus costs are high. Furthermore, heat must be radiated from the lighting device because its use has been accompanied by heat generation. However, there is no mention of thermal radiation in the Publication.

SUMMARY OF THE INVENTION

It is an object of the present invention to provide a waterproof and light-weight electronic apparatus capable of improving assembling workability, and a lighting device.

It is another object of the present invention to provide a waterproof, thermal radiating and light-weight electronic apparatus, and a lighting device.

To achieve the object, an electronic apparatus of the present invention comprises a circuit module which comprises a circuit board and a plurality of electric components mounted on the board, a tray which houses the circuit module and has a raised bottom projecting toward the circuit board, and a filling material having waterproof properties and electric insulation, the circuit board and the electric components being buried in the filling material, the tray being filled with the filling material including them.

According to the invention, for example, the tray can be made of a synthetic resin or rubber. As the synthetic resin of the tray, a synthetic resin such as polypropylene (PP) or polyethylene terephthalate (PET) can be suitably used. Such a material has low costs and heat resistance to endure a heating hardening processing temperature of the filling material. As the rubber of the tray, for example, ethylene propylene rubber (EPDM) can be used.

According to the invention, one or more raised bottoms can be disposed in the tray. Preferably, the raised bottoms are disposed corresponding to an area in which an arrangement density of electric components of the circuit module is low, and an area in which electric components of low heights such as chip components concentrate. The raised bottoms may be continuously disposed in a side wall of the tray. The raised bottoms can be spaced from the side wall of the tray, providing a passage.

According to the invention, for the filling material, a synthetic resin such as a silicon resin, a urethane resin, an epoxy resin, or an unsaturated polyester resin can be used. The use of the urethane resin is preferable because of its low material costs. When the silicon resin or the unsaturated polyester resin is used, higher thermal radiating properties can be obtained.

The electronic apparatus of the invention comprises the tray, and the circuit board and the electric components of the circuit module housed in the tray are buried in the electric insulating and waterproof filling material which fills the tray. Accordingly, by the filling material in the tray, it is possible to waterproof the circuit board, the electric components or the like of the circuit module to endure a highly humid environment. Thus, no waterproof case is necessary to waterproof the circuit module. Additionally, by disposing the raised bottoms in the tray, the amount of using the filling material is reduced, whereby the electronic apparatus can be made light. Besides, by the raised bottoms, time necessary for inpouring the filling material into the tray can be shortened. Moreover, as the raised bottoms increase strength of the tray, it is possible to improve workability when the tray is put over the circuit module.

Thus, it is possible to provide the electronic apparatus having waterproof properties to endure a highly humid environment, light weight, and improved assembling workability.

To achieve the object, an electronic apparatus of the present invention comprises a circuit module which comprises a circuit board and a plurality of electric components mounted on the board, a waterproof resin member encapsulating the circuit board and the electric components and comprising a component cover layer and a back cover layer, the component cover layer having a recess extending toward a surface of the electric board and covering the electric components and the surface of the electric board on which the electric components are mounted, and the back cover layer covering the other surface of the electric board.

According to the invention, one or more recess sections can be disposed of the resin member. Preferably, the recess sections are disposed corresponding to an area in which an arrangement density of electric components of the circuit module is low, and an area in which electric components of low heights such as chip components concentrate. The recess sections may be continuously disposed in a side wall of the resin member.

According to the invention, for the resin member, a synthetic resin such as a silicon resin, a urethane resin, an epoxy resin, or an unsaturated polyester resin can be used. The use of the urethane resin is preferable because of its low material costs. When the silicon resin or the unsaturated polyester resin is used, higher thermal radiating properties can be obtained. According to the invention, an electric component such as a chip component may be surface-mounted on a surface of the circuit board covered with the back cover layer.

According to the electronic apparatus of the invention, the circuit board and the electric components of the circuit module are buried in the waterproof resin member. Accordingly, by the resin member, it is possible to waterproof the circuit board, the electric components or the like of the circuit module to endure a highly humid environment. Thus, no waterproof case is necessary to waterproof the circuit module. Additionally, by disposing the recess sections in the component cover layer of the resin member, the amount of using the resin member is reduced, whereby the electronic apparatus can be made light. Besides, heat of the electronic components generated during their use is transferred to the resin member, and radiated from a surface of the resin member. An area for the heat radiation can be increased more by the recess sections.

Therefore, it is possible to provide the electronic apparatus having waterproof and heat-radiating properties, and light weight.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is a sectional view cut along the line F4-F4 of FIG. 2;

FIG. 20 is a sectional view showing a connector cap which a tray disposed in the lighting device of FIG. 19;

FIG. 21 is a perspective view showing an electric component equipped with an explosion-proof valve mounted on a circuit module disposed in the lighting device of FIG. 19;

FIG. 22A is a sectional view showing a state in which the electric component of FIG. 21 is buried in a filling material;

FIG. 22B is a sectional view showing an operated state of the explosion-proof valve of the electric component of FIG. 21 buried in the filling material;

FIG. 32 is a perspective view showing a relation between a forming die used for manufacturing the waterproof assembly of the lighting device of FIG. 24 and the circuit module of FIG. 30;

DETAILED DESCRIPTION OF THE INVENTION

A first embodiment of the present invention will be described with reference to FIGS. 1 to 14.

Figure 1:
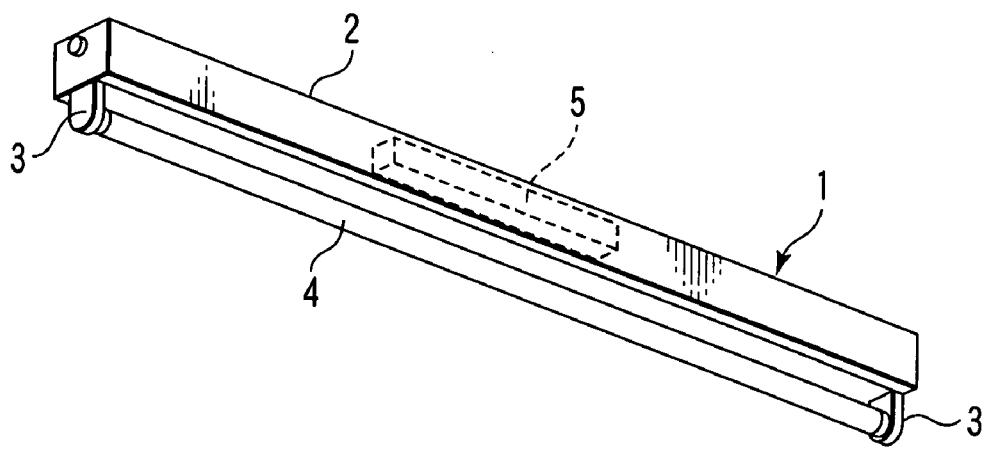
FIG. 1 is a perspective view showing a luminaire according to a first embodiment of the present invention.

Referring to FIG. 1, a reference numeral 1 denotes a luminaire which comprises an electronic ballast (described later) to function as an electronic apparatus. The luminaire 1 is used as an outdoor lamp, a tunnel lamp installed in a tunnel, a lamp under the eaves of a station house, or the like having preferable waterproof properties. This luminaire 1 comprises a chassis 2, a lamp socket 3, a discharge lamp, a waterproof lighting device 5. For the discharge lamp, for example, a straight tube type fluorescent lamp 4 is used. For the lighting device 5 that lights the fluorescent lamp 4, a waterproof electronic apparatus such as an electronic ballast is used.

The chassis 2 illustrated in FIG. 1 is made of a metal and formed into a rectangular parallelepiped shape. For example, lamp sockets 3 are disposed in both longitudinal ends of the chassis 2 to project downward. The fluorescent lamp 4 is detachably supported by the lamp sockets 3. The lighting device 5 that lights the fluorescent lamp 4 is incorporated in the chassis 2.

Figure 2:
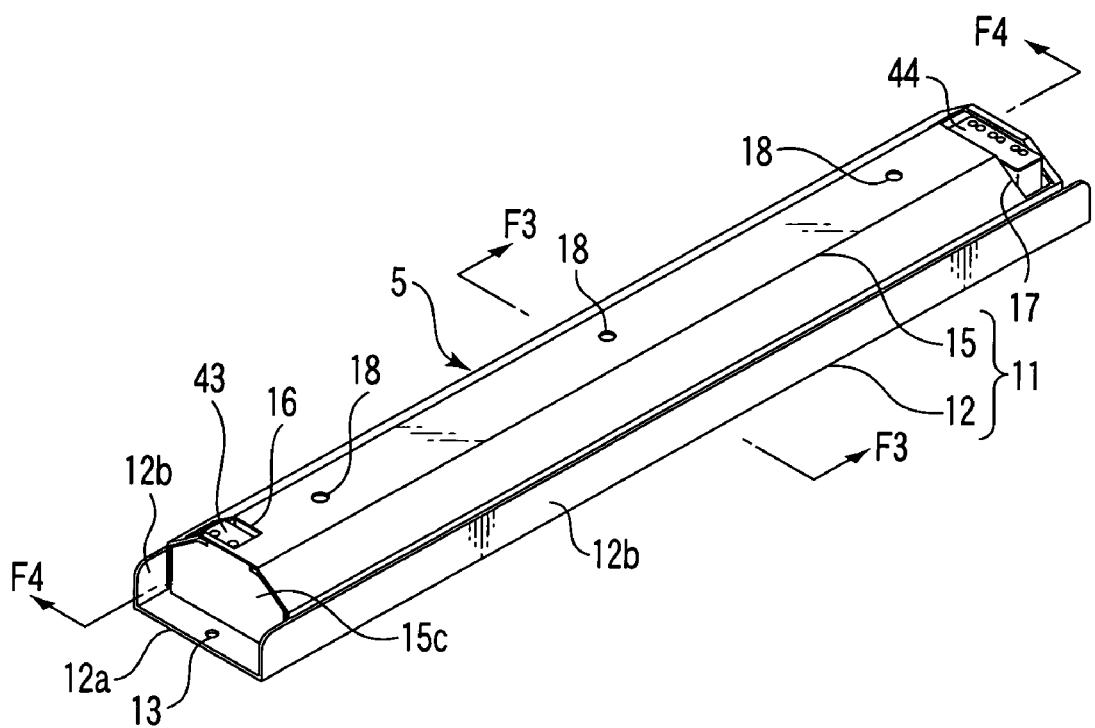
FIG. 2 is a perspective view showing a lighting device disposed in the luminaire of FIG. 1 according to the first embodiment.

Referring to FIGS. 2 to 4, the lighting device 5 comprises a shell case 11, a circuit module 21, a tray 41, and a filling material 55.

The shell case 11 comprises a housing base 12, and a cover 15 connected thereto. The housing base 12 and the cover 15 are connected to each other by hooking, e.g., a bend section (not shown) on a receiving section such as a hole or a notch. The bend section is formed in one of the housing base 12 and the cover 15, while the receiving section is formed in the other.

Preferably, the housing base 12 and the cover 15 are made of metals such as aluminum alloys of good thermal radiating properties. Instead, the housing base 12 and the cover 15 can be made of iron metals of low material costs.

Figure 3A:
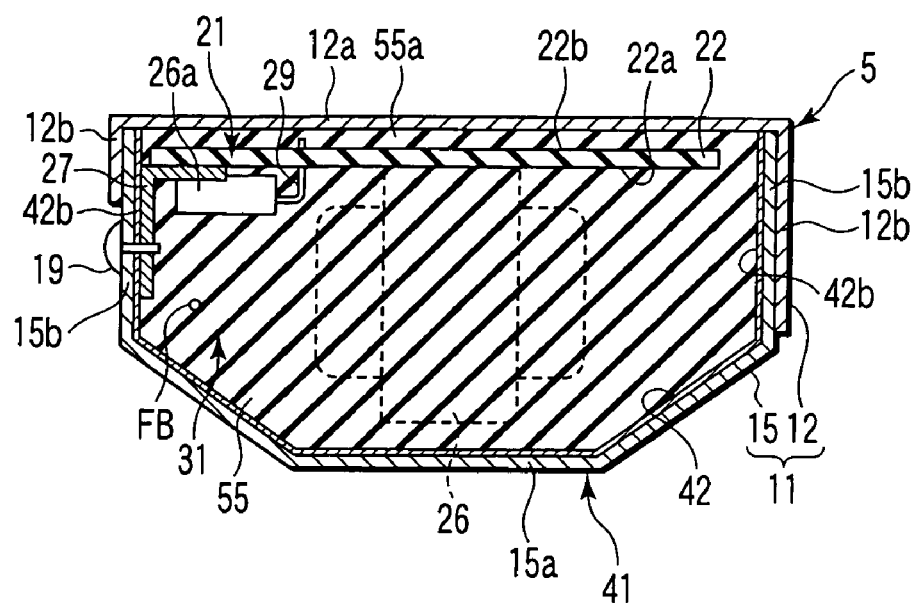
FIG. 3A is a sectional view cut along the line F3-F3 of FIG. 2.

Referring to FIGS. 2 and 3A, the housing base 12 comprises a base wall 12a and a side wall 12b. The side walls 12b are bent to be perpendicular from both width-direction ends of the base wall 12a. A total length of the housing base 12 is longer than a circuit board 22 (described later). Fixing sections 13 are formed in both longitudinal ends of the base wall 12a. Each fixing section 13 comprises a hole or a notch.

The lighting device 5 is mounted to the chassis 2 by bringing the base wall 12a into contact with the chassis 2. A fixing component such as a screw through the fixing section 13 is in charge of this mounting. The housing base 12 functions as a heat transfer surface to the chassis 2.

Referring to FIGS. 3A and 4, for example, the cover 15 comprises a cover main wall 15a, a side wall 15b, and an end wall 15c. The main cover 15a has obliquely bent portions in both width-direction sides of the cover 15. The side walls 15 are bent from these portions. The cover main wall 15a and the side wall 15b constitute a horizontal gutter structure. The end walls 15c are bent to be perpendicular from both longitudinal ends of the cover main wall 15a. The end walls 15c are disposed to close both longitudinal ends of the horizontal gutter structure.

The cover 15 is formed to be shorter than the housing base 12 to expose the fixing sections 13. The side wall 15b of the cover 15 is in contact with an inner surface of the side wall 12b of the housing base 12. These side walls 12b and 15b are connected to each other. The housing base 12 and the cover 15 can transfer heat through the stacked side walls 12b and 15b.

A hole-shaped section 16 is bored in one longitudinal end of the cover 15. A hole-shaped section 17 is bored in the other longitudinal end of the cover 15. These hole-shaped sections 16, 17 are square. One hole-shaped section 16 is disposed to expose an input connector cap 43. The other hole-shaped section 17 is disposed to expose an output connector cap 44.

The circuit module 21 that lights the fluorescent lamp 4 comprises an electric insulating printed circuit board 22, a lighting circuit 23 (see FIGS. 7 and 9), an input electric wire connector 24, and an output electric wire connector 25.

The circuit board 22 has electric insulation and a rectangular shape of a size to be housed in the cover 15. One surface of the circuit board 22 is mainly used as a component mounting surface 22a. The other surface of the circuit board 22 is mainly used as a soldered surface 22b. A circuit pattern is printed on the soldered surface 22b. The soldered surface 22b is covered with an insulating resist layer (not shown).

Figure 7:
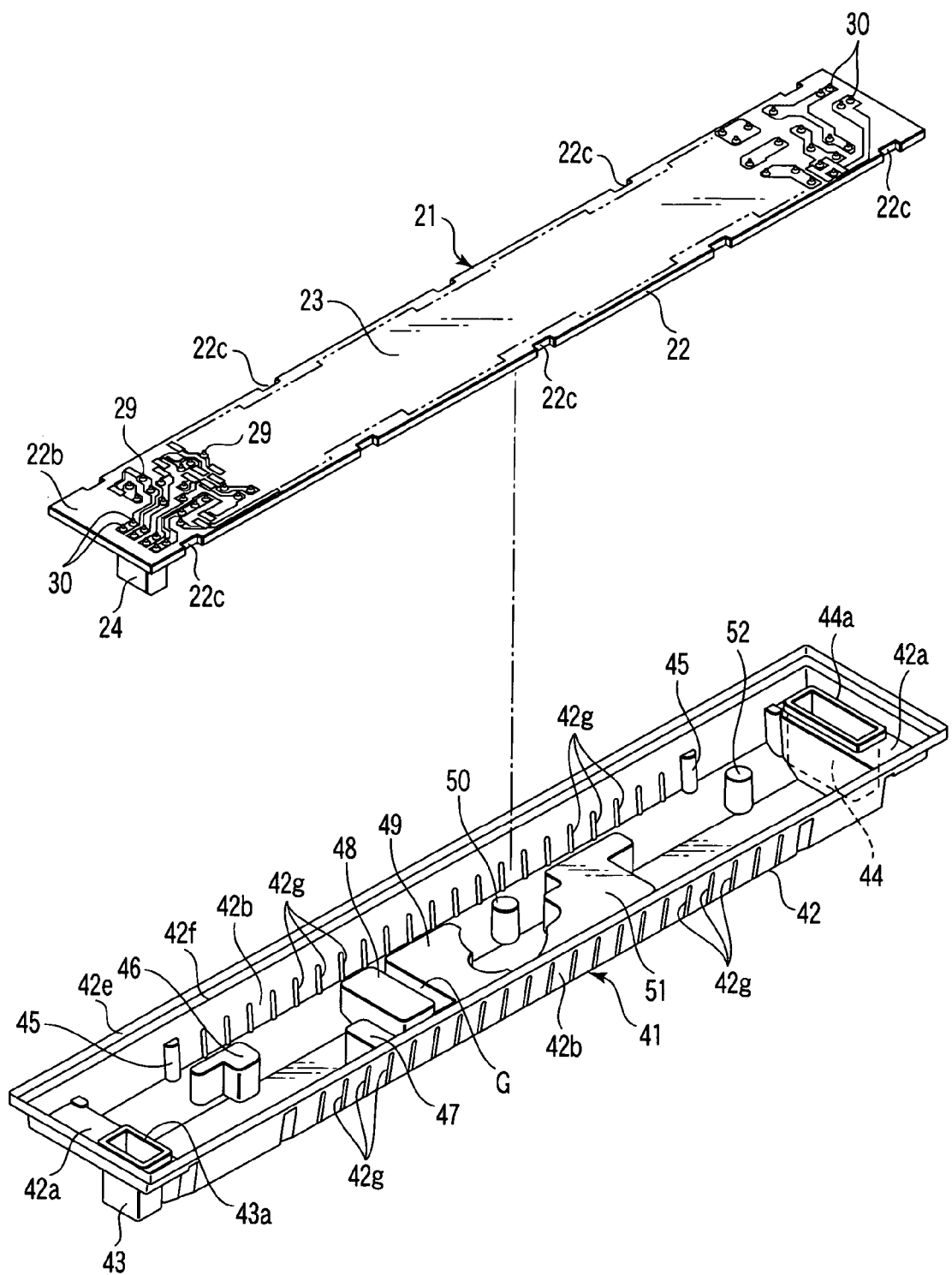
FIG. 7 is a perspective view showing the tray of FIG. 6 and a circuit module housed therein in a separated state seen from the back.
Figure 8:
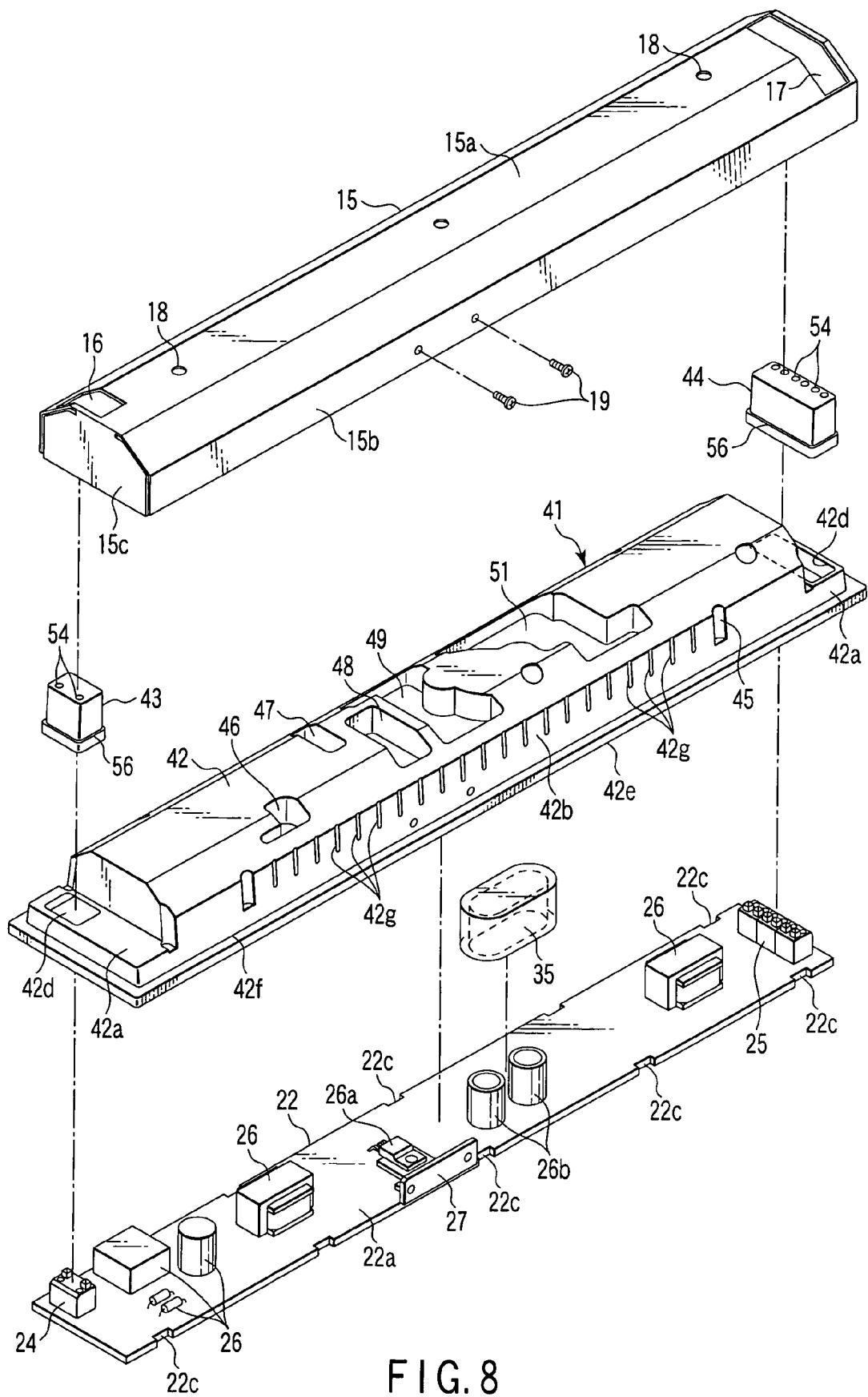
FIG. 8 is a perspective view showing the tray and the circuit module of FIG. 6, and a cover for housing the same in an exploded state from the front.
Figure 9:
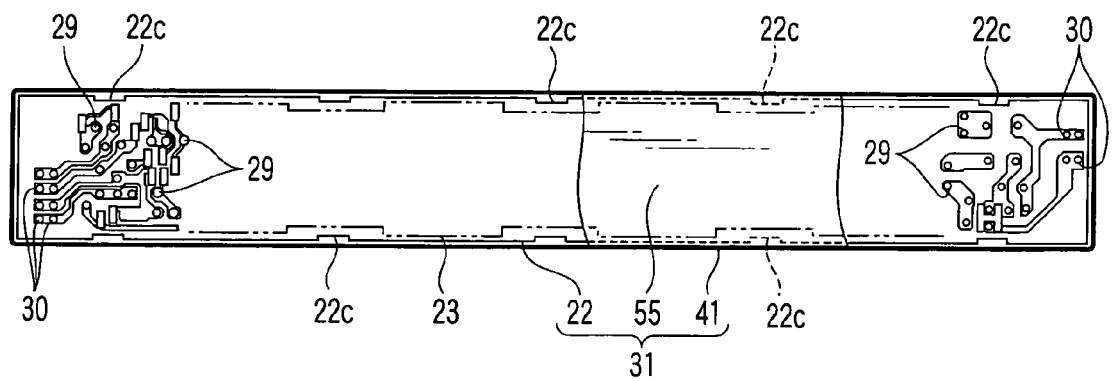
FIG. 9 is a partially cutaway back view showing the waterproof assembly of FIG. 5.
Figure 10:
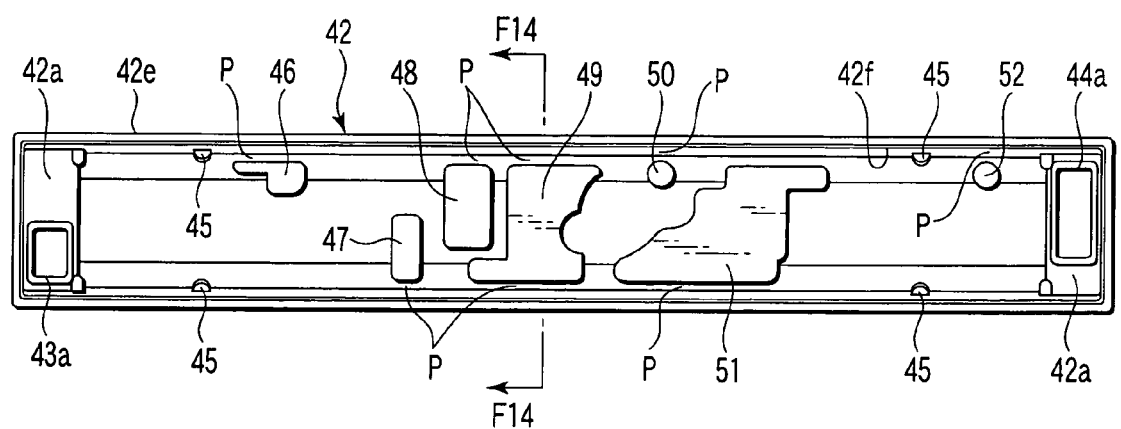
FIG. 10 is a back view showing the tray disposed in the waterproof assembly of FIG. 5.

For example, the circuit board 22 comprises a plurality of notches 22c as passing sections to reach its front and back. As shown in FIGS. 7 to 9 or the like, the notches 22c are disposed in both side edges of the circuit board 22. The notches 22c are kept away from the circuit pattern. The passing sections may be disposed in any places as long as they do not cut off the circuit pattern. The passing sections can be constituted of through-holes positioned between both side edges of the circuit board 22. Each passing sections can serve both as a through-hole and a notch. The notch 22c or the through-hole is small, 3 mm or less. However, it is useful for inpouring a filling material 55w when the tray 41 is filled with the unhardened filling material 55w (described later).

The lighting circuit 23 is constituted by combining the circuit pattern and a plurality of electric components 26 connected thereto (see FIGS. 4 and 8 or the like). For example, the lighting circuit 23 includes an inverter controlled lighting circuit section. As the electric components 26, a semiconductor such as a power transistor, a resistor, a capacitor, a coil, a transformer, a diode, and various other chip components can be cited.

Referring to FIG. 8, a reference numeral 26a denotes a power transistor which is one of the electric components 26, and accompanied by heat generation. A reference numeral 27 denotes a thermal radiating plate thermally connected to the power transistor 26a. The thermal radiating plate 27 also functions as an earth of the lighting circuit 23. As shown in FIG. 3A, the thermal radiating plate 27 is slightly protruded from one side edge of the circuit board 22. This thermal radiating plate 27 is erected on one side edge of the circuit board 22 to be perpendicular to the component mounting surface 22a.

The lighting circuit 23 is formed over both front and back of a middle portion excluding both longitudinal ends of the circuit board 22. Most of the electric components constituting the lighting circuit 23 are mounted on the component mounting surface 22a. In addition to the surface mounted components such as chip components, the electric components 26 include a plurality of electric components mounted on the circuit board 22 by flow solder processing. Each electric component subjected to the flow solder processing comprises a pin-shaped terminal 29 to penetrate the circuit board 22. By passing the circuit board 22 through a flow solder layer, the terminal 29 is soldered to each land of the circuit pattern to mount the electric component subjected to the flow solder processing on the circuit board 22.

Referring to FIG. 8, the input electric wire connector 24 is soldered to one longitudinal end of the circuit board 22. The output electric wire connector 25 is soldered to the other longitudinal end of the circuit board 22. These electric wire connectors 24, 25 also comprise pin-shaped terminals 30. The electric wire connectors 24, 25 are mounted together with the electric components having the terminals 29 on the circuit board 22 by flow solder processing. A core wire of an insulating covered electric wire (not shown) for a power source is inserted to be connected to the electric wire connector 24. A core wire of an insulating covered electric wire (not shown) for in-apparatus wiring is inserting to be connected to the electric wire connector 25.

Referring to FIGS. 4 and 8, a reference numeral 35 denotes a component cap. The component cap 35 is made of an electric insulator such as a hard synthetic resin or synthetic rubber. The component cap 35 is disposed over a certain electric component to prevent contact of the filling material 55 with this electric component. The electric component isolated from the filling material 55 by the component cap 35 is an electric component which should not preferably be brought into contact with the filling material 55 to be buried therein. As the electric component of this type, for example, an electrolytic capacitor 26c can be cited. The electric component 26 covered with the component cap 35 may or may not be brought into contact with an inner surface of the component cap 35.

An opening surface of the component cap 35 is in contact with the component mounting surface 22a of the circuit board 22. Preferably, the component cap 35 is fixed to the component mounting surface 22a by an adhesive (not shown). Accordingly, it is possible to obtain a sealing function of holding the component cap 35 on the circuit board 22, and preventing incursion of an unhardened filling material into the component cap 35.

The tray 41 is a filling container filled with a filling material 55. Referring to FIGS. 3A and 4, the tray 41 comprises a tray main body 42, and a plurality of, e.g., a pair of connector caps 43, 44. A planar shape of the tray main body 42 is slightly smaller than the cover 15. The tray main body 42 is housed in the cover 15 to be brought into contact with its inner surface. The connector caps 43, 44 are formed separately from the tray main body 42.

Preferably, the tray main body 42 is made of a molded article of an inexpensive electric insulating material having heat resistance. As the insulating material of this type, for example, polyethylene terephthalate can be cited. The plate thickness of the tray main body 42 is smaller than those of the housing base 12 and cover 15.

Referring to FIGS. 6 to 8, 10, 12, or the like, the tray main body 42 comprises cap connecting sections 42a in both longitudinal ends thereof. A depth of the tray main body 42 between the cap connecting sections 42a is larger than that of the tray main body 42 in the cap connecting section 42a. This depth portion is formed into a size to be brought into contact with the inner surface of the cover 15. For example, as shown in FIG. 8, a square cap through-hole 42d is formed in each cap connecting section 42a.

Figure 5:
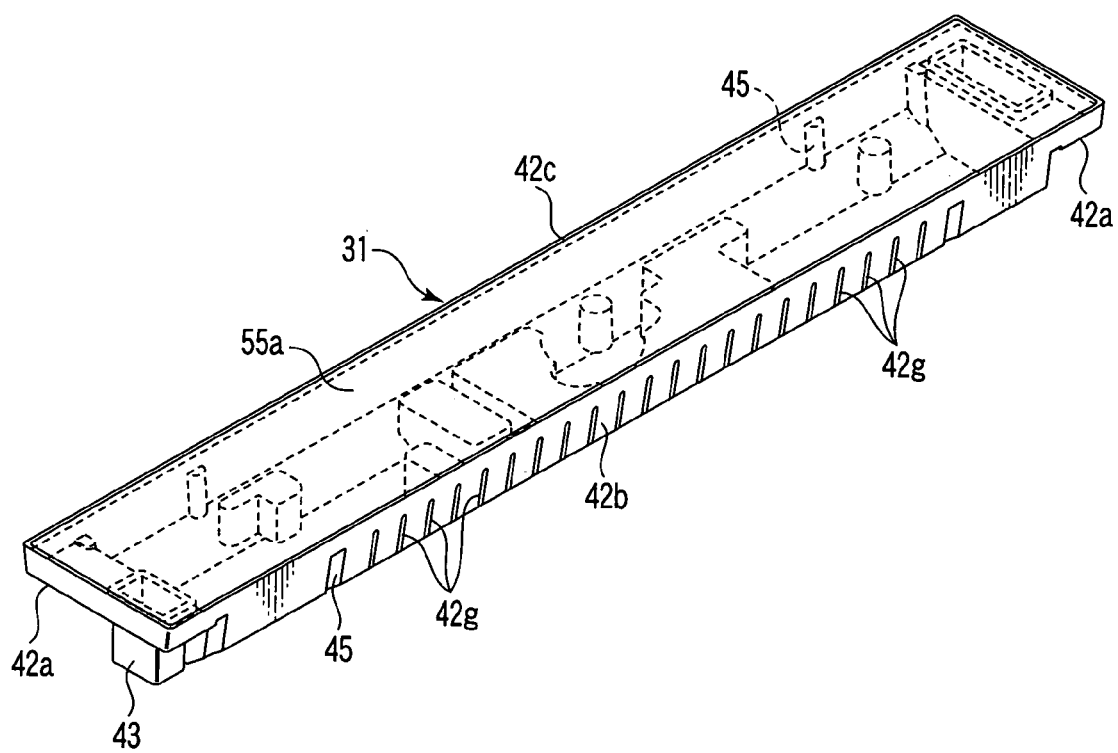
FIG. 5 is a perspective view showing a waterproof assembly of the lighting device of FIG. 2 seen from the back.
Figure 6:
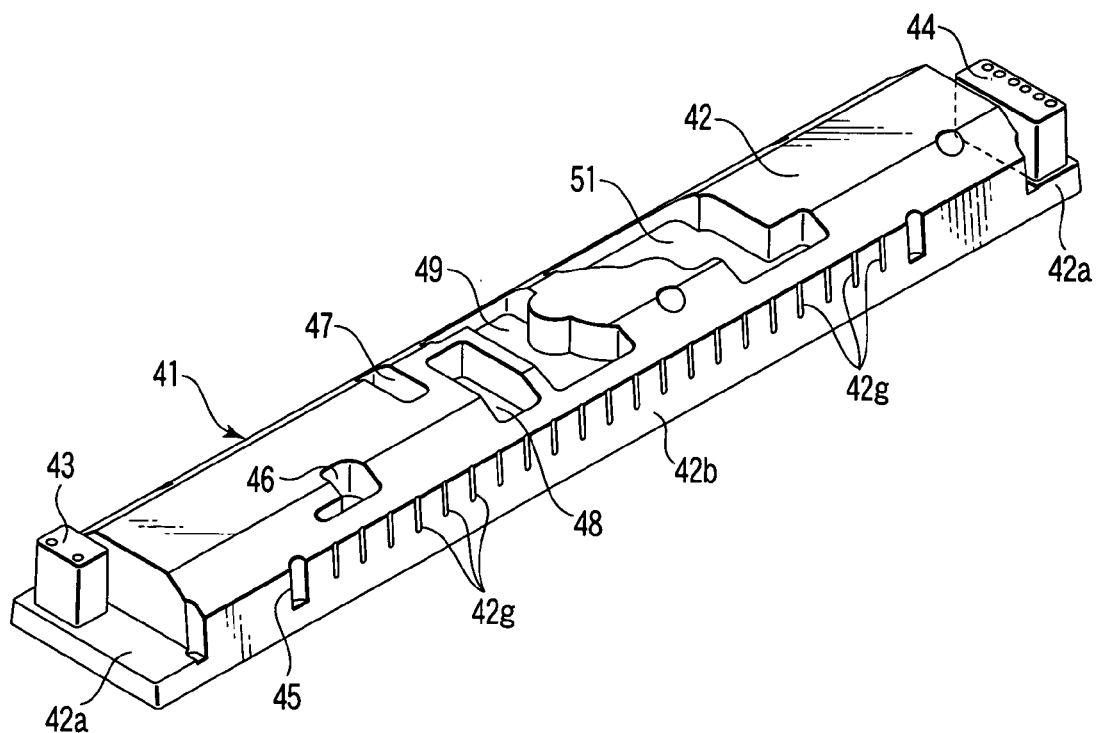
FIG. 6 is a perspective view showing a tray disposed in the waterproof assembly of FIG. 5 seen from a front.

Referring to FIGS. 3A, and 5 to 8, a reference numeral 42b denotes a side plate of the tray main body 42. In FIG. 5, a reference numeral 42c denotes an opening edge of the tray main body 42. The opening edge 42c is continuous from the depth portion to the left and right cap connecting sections 42a. For example, this opening edge 42c is rectangular.

The opening edge 42c is formed by cutting a cut edge section 42e of the tray main body 42. In other words, a reference numeral 42f in FIGS. 7 to 12 excluding FIG. 9 denotes a corner equivalent to the opening edge 42c. The cut edge section 42e is integrally continuous from the corner 42f. The cut edge section 42e is formed one-size larger than the corner 42f into a skirt shape. The cut edge section 42e is cut along the corner 42f to form the opening edge 42c.

Referring to FIGS. 5 to 8, a plurality of rib convex sections 42g are formed in each side plate 42b of the tray main body 42. These rib convex sections 42g are disposed at predetermined intervals in a longitudinal direction of the side plate 42b. The respective rib convex sections 42g extend in a direction orthogonal to the longitudinal direction of the side plate 42b. The side plate 42b is concaved from the outside so that the rib convex sections 42g project from the inner surface of the side plate 42b. The side plate 42b can be concaved from the inside so that the rib convex sections 42g project from the outer surface of the side plate 42b. The rib convex sections 42g reinforce the side plate 42b.

Referring to FIG. 7 or the like, a plurality of support convex sections 45 are formed in the tray main body 42. These support convex sections 45 project to the inner surface of the side plate 42b and extend in a thickness direction (up-and-down direction) of the tray 41.

The tray 41 comprises a plurality of raised bottoms 46 to 52 integrally formed to be positioned between the cap connecting sections 42a of both longitudinal ends thereof. The raised bottoms 47 to 51 concentrate in a longitudinal center of the tray main body 42.

The raised bottoms 46 to 52 are disposed corresponding to an area of a low arrangement density of the electric components 26 of the circuit module 21, an area in which low electric components such as chip components concentrate, or the like. Accordingly, as shown in FIGS. 4, 8 or the like, an outer surface of the tray main body 42 is rough. This roughness is due to the arrangement, height or the like of the electric components 26.

The raised bottoms 46 to 52 are all spaced from the side plate 42b of the tray main body 42. Thus, passages P (see FIGS. 10 and 14) are formed between the raised bottoms 46 to 52 and the side plate 42b in a state before the tray 41 is filled with the filling material 55. These passages P communicate both longitudinal sides of the tray 41 with each other while the raised bottoms 46 to 52 are set as boundaries.

With the configuration in which the passages P are disposed to form the raised bottoms 46 to 52, a modulus of elasticity of a cross section of the tray main body 42 passed through the raised bottoms 46 to 52 is enlarged. Accordingly, strength of the tray main body 42 is improved to make bending of its center difficult. Thus, handling of the tray 41 is facilitated even when its plate thickness is small. This can contribute to facilitation of the work of putting the tray over the circuit module 21 when the lighting device 5 is assembled. Both ends of the tray main body 42 are improved in strength by the cap connecting sections 42a.

For example, the connector caps 43, 44 are made of synthetic rubber. One connector cap 43 can be elastically deformed to cover the input electric wire connector 24 tightly and be coupled to. The connector cap 43 is watertightly put through one cap through-hole 42d. The other connector cap 44 can be elastically deformed to cover the output electric wire connector 25 tightly and be coupled to. The connector cap 44 is watertightly put through the other cap through-hole 42d.

Structures of the connecter caps 43, 44 water-tightly put through the cap through-holes 42d are similar. Thus, a representative relation between the connector cap 44 and its corresponding cap through-hole 42d will be described. The connector cap 44 comprises an annular groove 56 in an outer periphery of its open end surface 44a side (see FIGS. 12 and 13). A hole edge of the cap through-hole 42d is fitted in the groove 56. Accordingly, watertightness is improved between the connector cap 44 and the cap through-hole 42d.

The open end surfaces 43a, 44a of the connector caps 43, 44 are positioned in the tray main body 42, and height positions thereof are roughly similar to those of the support convex sections 45. Height positions of the bottom surfaces of the raised bottoms 46 to 52 are lower than those of the open end surfaces 43a, 44a. The open end surfaces 43a, 44a of the connector caps 43, 44 are in contact with the component mounting surface 22a of the circuit board 22. Preferably, the connector caps 43, 44 are fixed to the component mounting surface 22a by an adhesive 53 representatively shown in FIG. 12. Accordingly, the connector caps 43, 44 and the circuit board 22 are sealed from each other. Thus, incursion of an unhardened filling material into the connector caps 43, 44 is prevented.

Referring to FIG. 8, each of the connector caps 43, 44 comprises a plurality of electric wire inserting sections 54. An end of the insulating covered electric wire for the power source or the in-apparatus wiring in the apparatus is inserted into the electric wire inserting section 54. As representatively shown by the connector cap 44 of FIG. 12, the electric wire inserting section 54 has a thin portion 54a in which a small hole is bored. A plurality of annular projections 54b are disposed in an inner surface of the electric wire inserting section 54.

A core wire and an end exposed to the end of the insulating covered electric wire are pushed through the thin portion 54b to be inserted into the electric wire inserting section 54. This insertion brings an outer periphery of the electric wire end into tight contact with each annular projection 54b to improve watertightness. The core wire of the electric wire end inserted into the electric wire inserting section 54 is inserted into the electric wire connector 24 or 25. The inserted core wire is inserted into a terminal (not shown) incorporated in the electric wire connector 24 or 25, and electrically and mechanically connected to the terminal.

The circuit module 21 is housed in the tray 41 while its component mounting surface 22a faces the inside of the tray 41. Before this housing, the component cap 35 is mounted to the component mounting surface 22a to cover an electrolytic capacitor 26b. The connector cap 43 over the electric wire connector 24 and been coupled thereto. The connector cap 44 over the electric wire connector 25 and seen coupled thereto. Besides, the housing of the circuit module 21 in the tray 41 is accompanied by fitting of the hole edges of the cap through-holes 42d in the grooves 56 of the connector caps 43, 44.

By the housing, both longitudinal ends of the circuit board 22 are mounted to be supported on the open end surfaces 43a, 44a of the connector caps 43, 44. Similarly, by the housing, the middle portion of the circuit board 22 is mounted to be supported on the plurality of support convex sections 45. By these supports, and the fitting of the hole edges of the cap through-holes 42d to the connector caps 43, 44, the circuit module 21 is positioned in a predetermined position of the tray 41.

Accordingly, the circuit module 21 is housed in the tray 41. The terminal 29 of the electric component 26 of the circuit module 21, and tips of the terminals 30 of the electric wire connectors 24, 25 are directed upward to project from the soldered surface 22b of the circuit board 22. However, the terminals 29, 30 are arranged lower than the corner 42f equivalent to the opening edge 42c of the tray 41 (see FIG. 12).

As illustrated in FIGS. 3A and 4, the tips (lower ends in FIGS. 3A and 4) of the electric components 26 are all spaced from the inner surface of the tray main body 42. By the housing, the raised bottoms 46 to 52 of the tray main body 42 face the area in which the arrangement density of the electric components 26 of the circuit module 21 is low and the area in which the electric components of low height such as chip components concentrate.

Figure 3B:
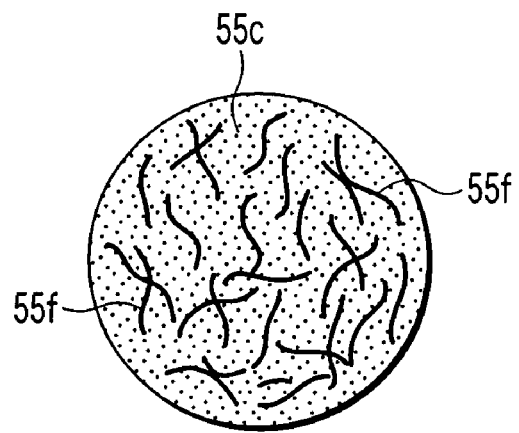
FIG. 3B is an enlarged view of an FB portion of FIG. 2.

The filling material 55 is a synthetic resin having electric insulation and waterproof properties. As a preferable example, a urethane resin mixed with a filler denoted by a reference numeral 55f of FIG. 3B is used for the filling material 55. In FIG. 3B, a reference numeral 55c denotes a resin. The filler 55f is made of an inorganic material or metal oxide. As the filler 55f of an inorganic material, aluminum oxide is suitably used. The mixing of the filler 55f is preferable because it improves thermal radiating properties of the filling material 55. A mixing ratio of the filler 55f in the resin 55c is set to match required thermal radiating properties.

The filling material 55 fills the tray 41 by burying the circuit board 22 of the circuit module 21 and the electric components 26 housed in the tray 41 therein. This filling is executed by inpouring an unhardened filling material 55w into a gap between the open edge 42c of the tray 41 and the circuit board 22, especially through the notch 22c. This situation is indicated by a chain double-dashed line in FIG. 14.

An opening through which the unhardened filling material 55w flows to the lower side of the circuit board 22 is expanded more than other gaps by the notch 22c. Accordingly, the inpouring of the filling material 55w facilitates passage of air of the lower side of the circuit board 22 through other notches 22c not used for inpouring. Thus, even the filling material 55w having certain viscosity can be smoothly inpoured to fill the tray 41.

Thus, when the lighting device 5 is assembled, time necessary for filling with the filling material 55 is shortened to contribute to a cost reduction. Besides, the inpouring is accompanied by a flow of the filing material 55w in a longitudinal direction in the tray 41. In this case, the filling material 55w can be passed through the passages P between the side plate 42b and the raised bottoms 46 to 52. Accordingly, the time necessary for filling can be shortened.

Good substitution of the filling material 55w for air enables suppression of filling failures. In other words, it is possible to prevent formation of a cavity caused by residual air between the component mounting surface 22a and the tray main body 42. Remaining of a cavity in the filling material 55 is not preferable from the standpoint of waterproof and insulation as moister possibly stays therein.

The notch 22c not used for the inpouring during the filling with the filling material 55w is used as a return passage of an extra portion of the inpoured filling material 55w. Through this return passage, the inpoured filling material 55w can be caused to reversely flow from the lower side of the circuit board 22 to its upper side.

Figure 11:
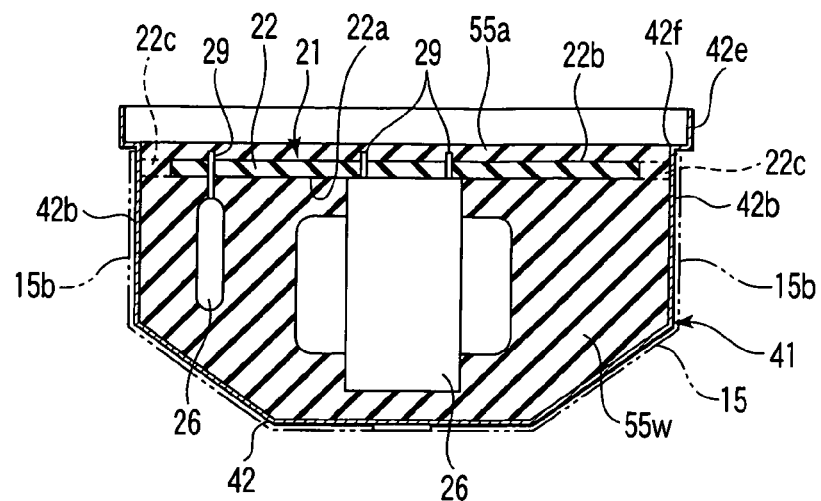
FIG. 11 is a sectional view showing a state in which a filling material is injected into the tray which houses the circuit module shown in FIG. 7.
Figure 12:
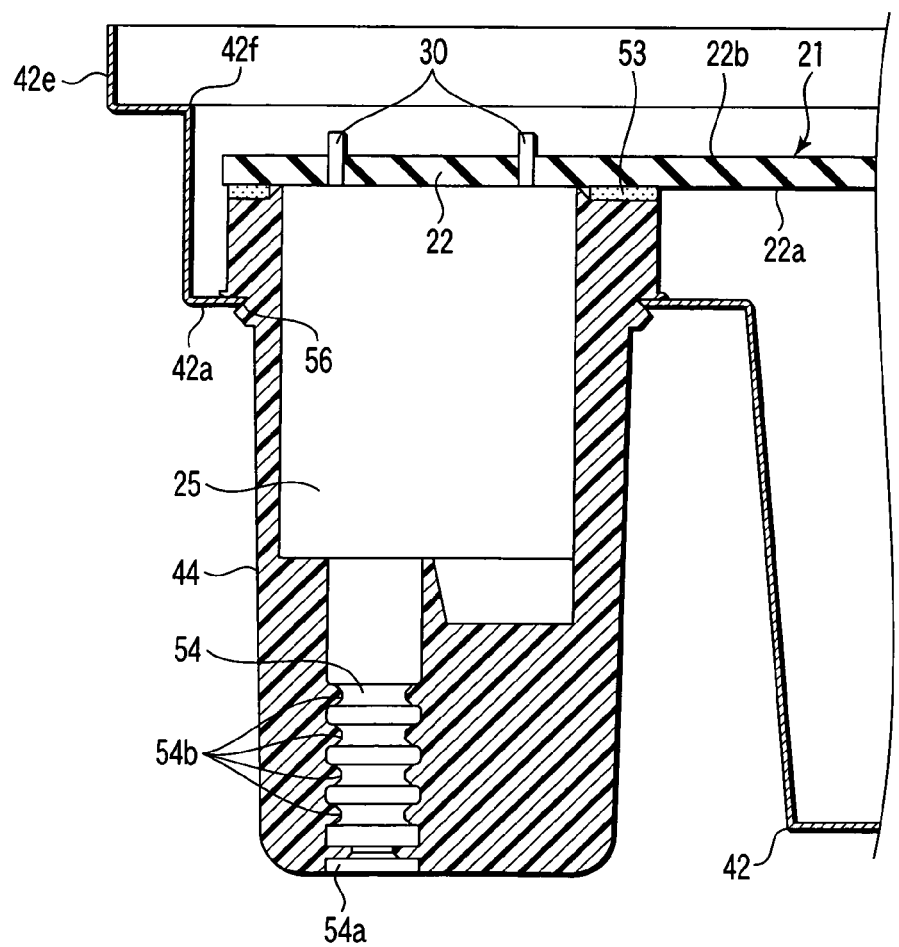
FIG. 12 is a sectional view showing a relation between the tray and a connector cap disposed in the waterproof assembly of FIG. 5.
Figure 13:
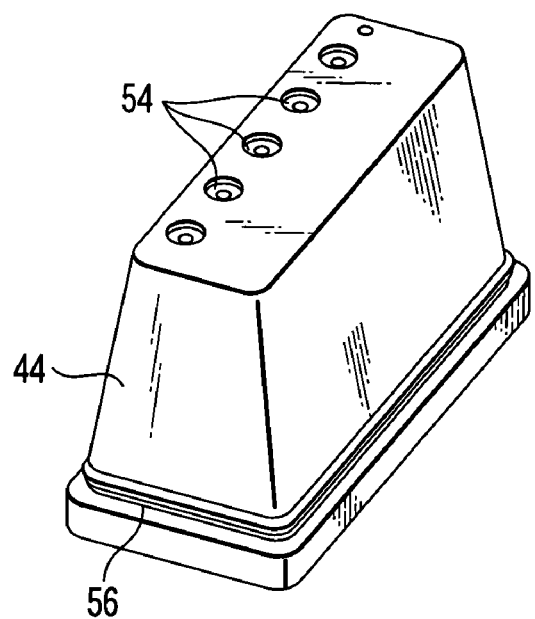
FIG. 13 is a sectional view showing the connector cap disposed in the waterproof assembly of FIG. 5.
Figure 14:
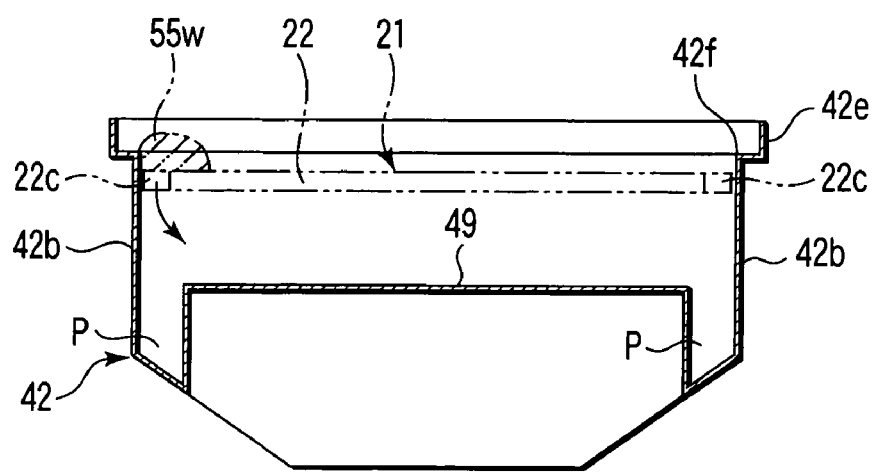
FIG. 14 is a sectional view of the tray shown along the line F14-F14 of FIG. 10.

Accordingly, the soldered surface 22b is covered with the filling material 55w to enable its insulation. This state is shown in FIG. 11. The filling with the filling material 55w is stopped, by using the corner 42f of the tray 41 as an indicator, when an upper surface of the filling material 55w reaches the corner 42f.

During the filling, weight of the filling material 55w is applied on the side plate 42b of the tray 41. The side plate 42b is reinforced by the plurality of rib convex sections 42g disposed therein. Accordingly, it is possible to suppress outside deformation of the side plate 42b to increase the width of the tray 41. Thus, it is possible to easily maintain a shape of the tray 41 and to suppress a variance in filling amount of the filling material 55w.

The connector caps 43, 44 held to respectively cover the electric wire connectors 24, 25 are put through the cap through-holes 42d of the tray 41. In these put-through portions, the hole edges of the cap through-holes 42d are fitted in the annular grooves 56 of the connector caps 43, 44. Accordingly, leakage of the unhardened filling material 55w through the put-through portions to the outside of the tray 41 is prevented. Thus, it is possible to prevent an appearance failure of the waterproof assembly 31, and to suppress a variance in filling amount of the filling material 55w.

Preferably, the filling work should be implemented in a state in which the tray 41 housing the circuit module 21 is fitted inside the cover 15 (see chain double-dashed line in FIG. 11). In this case, deformation of the side plate 42b which accompanies the filling can be surely prevented by the cover 15. In the state in which the tray 41 is fitted in the cover 15, the connector caps 43, 44 are exposed to the hole-shaped sections 16, 17 facing each other. Accordingly, a state is set in which the insulating covered electric wire can be inserted into the electric wire inserting sections 54 of the connector caps 43, 44.

Referring to FIGS. 3A, 4, and 11, a reference numeral 55a denotes a soldered cover layer of the filling material 55 which covers the soldered surface 22b of the circuit board 22. The terminals 29, 30 are buried in the soldered cover layer 55a. A surface of the soldered cover layer 55a is preferably planar. For example, a height of this surface is equal to that of the corner 42f equivalent to the opening edge 42c of the tray 41. The surface height of the soldered cover layer 55a can be lower than that of the corner 42f.

The tray 41 roughly filled with the filling material 55w is passed through a heating and hardening furnace (not shown). Hardening processing is accordingly executed for the filling material 55w. The tray 41 made of PET can exhibit sufficient heat resistance to heat generated by the heating processing. The cut edge section 42e of the tray 41 is used when the tray 41 is handled in a period from the filling with the filling material 55w to the heating processing. The cut edge section 42e functions as a bank to suppress leakage of the unhardened filling material 55w in the tray 41 during its handling.

In the filling, preferably, the unhardened filling material 55w subjected to defoaming beforehand is used. Moreover, it is advised to execute defoaming for the unhardened filling material 55w about to be inpoured into the tray 41 or the filling material 55w already inpoured into the tray 41. The defoaming is executed by placing the filling material 55w in a pressure-reduced atmosphere. By such defoaming, it is possible to prevent formation of a cavity caused by residual air in the filling material 55.

After the heating processing, the cut edge section 42e is cut off. This cutting sets the opening edge 42c of the tray 41 and the surface of the soldered cover layer 55a in flush. The filling material 55, the tray 41, and the circuit module 21 thus assembled constitute the waterproof assembly 31. The waterproof assembly 31 guarantees waterproof properties for the circuit module 21 by waterproof properties of the filling material 55.

The tray 41 of the waterproof assembly 31 comprises the raised bottoms 46 to 52. Accordingly, as compared with a configuration of using a tray of no raised bottom, the amount of using the filling material 55 can be reduced. Thus, the waterproof assembly 31 can be made light. Moreover, it is possible to shorten the filling work time, and to reduce costs of the lighting device 5.

The waterproof assembly 31 is housed in the cover 15 to bring the outer surface of the tray 41 into contact with the inner surface of the cover 15. In other words, the tray 41 is housed in the cover 15 to fill the same. Accordingly, heat can be transferred from the waterproof assembly 31 to the cover 15. In this heat transfer, the rib convex sections 42g never, become spacers between the side wall 15b and the side plate 42b.

The thermal radiating plate 27 protruded from the circuit board 22 strongly presses one side plate 42b of the tray 41 to one side wall 15b of the cover 15 to contact each other tightly. The thermal radiating plate 27 is connected to the power transistor 26a of much heat generation. Thus, heat is surely transferred from the power transistor 26a via the thermal radiating plate 27 to the cover 15.

It is advised to fix the thermal radiating plate 27 to the cover 15 by a conductive fixing member such as a metal screws 19 (see FIGS. 3A and 8). By this fixing, one side plate 42b of the tray 41 is fixed to one side wall 15b of the cover 15. The screws 19 electrically connects the thermal radiating plate 27 which functions as an earth terminal to the cover 15.

The housing base 12 is put over the cover 15 which houses the waterproof assembly 31. Then, the housing base 12 and the cover 15 are connected together to assemble the shell case 11. By this assembling, the soldered cover layer 55a of the filling material 55 is covered with the base wall 12a of the housing base 12. The base wall 12a and the soldered cover layer 55a are brought into surface-contact with each other as shown in FIGS. 3A and 4. The soldered cover layer 55a is electrically insulating. Accordingly, irrespective of the surface-contact, no sheet member is necessary to electrically insulate the housing base 12 and the circuit module 21 from each other.

A large contact area is secured by the surface-contact. Thus, heat of the waterproof assembly 31 can be smoothly transferred to the housing base 12. When a gap is formed between the base wall 12a and the soldered cover layer 55a, a heat transfer member only needs to be disposed therebetween. This heat transfer member is made of a high heat transfer sheet having a thickness corresponding to the gap. The heat transfer member enables smooth heat transfer between the base wall 12 and the soldered cover layer 55a.

Drainage sections are disposed in the housing base 12 of the shell case 11 and the cover 15. In other words, as shown in FIGS. 2 to 4, a plurality of drainage sections 14 are made in the base wall 12a of the housing base 12. Associatively, a plurality of drainage sections 18 are made in the cover main wall 15a of the cover 15. These drainage sections 14, 18 comprise holes.

Humidity or the like may cause dew condensation between the shell case 11 and the tray 41, the soldered cover layer 55a or the like. In this case, dew condensation water can be discharged through the drainage sections 14 and 18 to the outside of the shell case 11. Accordingly, electric insulation of the lighting device 5 can be improved. Such drainage is effective for suppressing occurrence of rust in the shell case 11 when a shell case 11 is made of an iron metal.

The lighting device 5 of the aforementioned configuration comprises the tray 41 housed in the cover 15 of the shell case 11. The circuit module 21 housed in the tray 41 is buried in the filling material 55 which fills the tray 41 except the electric wire connectors 24, 25.

The filling material 55 is electrically insulating and waterproof. Thus, the circuit board 22 of the circuit module 21, the electric components 26, the soldered surface 22b, and the like can be waterproofed by the filling material 55.

The tray 41 has a size to be housed in the cover 15 to fill the same. By using this tray 41, the aforementioned waterproofing is realized inside the shell case 11. Accordingly, the shell case 11 is never enlarged by the waterproof configuration. Thus, it is possible to use a shell case made by an existing manufacturing apparatus. Moreover, by the waterproof configuration in the shell case 11, waterproof properties can be obtained to endure a highly humid environment without needing any large waterproof case to house the shell case 11.

Thus, the lighting device 5 can be formed compact. Besides, in addition to the assembling of the lighting device 5, no time and labor of housing the lighting device 5 in the waterproof case, and no subsequent time and labor of assembling the waterproof case are necessary. Accordingly, the lighting device 5 can be easily assembled.

As described above, it is possible to prevent a cost increase by using the waterproof case itself. Additionally, it is possible to reduce assembling costs. Thus, costs of the lighting device 5, and the luminaire 1 which comprises the same can be reduced.

Furthermore, as the raised bottoms 46 to 52 are disposed in the cover 15, the strength of the cover 15 is increased to facilitate the assembling. Moreover, by the raised bottoms 46 to 52, a filling volume of the filling material 55 is reduced, whereby a filling amount can be reduced. For this reason, costs of the lighting device 5 and the luminaire 1 which comprises the same can be reduced.

The filling material 55 of the lighting device 5 is not only waterproof but also thermal radiative. Accordingly, heat of the power transistor and other heat generating electric components can be transferred through the filling material 55 to the shell case 11. In this case, a capacity of the filling material 55 is large, and a heat transfer area from the filling material 55 to the shell case 11 is large. Thus, good thermal radiating properties can be obtained. Especially, it is possible to improve thermal radiating properties more by employing the filling material 55 mixed with the inorganic filler 55f.

Besides, as the circuit module 21 is buried in the filling material 55 as described above, dust can be surely prevented by the filling material 55. Thus, the configuration is suitable for the lighting device 5 used in a place of much dust, and the dustproof luminaire 1 which comprises the same.

The connector caps 43, 44 tightly fitted over the electric wire connectors 24, 25 are bonded to the component mounting surface 22a of the circuit board 22. Accordingly, during the manufacturing of the waterproof assembly 31, incursion of the unhardened filling material 55w inpoured into the tray 41 into the connector caps 43, 44 is prevented. Thus, the filling material 55w never enters the electric wire connectors 24, 25. As a result, when the insulating covered electric wires are inserted into the electric wire connectors 24, 25 of the manufactured lighting device 5 to be connected, there is no possibility that this connection will be inhibited by the hardened filling material 55.

During the manufacturing of the waterproof assembly 31, the electrolytic capacitor 26b is isolated from the unhardened filling material 55w which fills the tray 41 by the component cap 35 covering the capacitor. In other words, the filling material 55w filling the tray 41 will never be brought into contact with the electrolytic capacitor 26b to bury the same. Thus, there is no possibility that the hardened filling material 55 will cause a functional reduction of the electrolytic capacitor 26b. The electrolytic capacitor 26b can exhibit a predetermined function.

The lighting device 5 is manufactured through the following first to sixth steps.

In the first step, the circuit module 21 is manufactured. This circuit module 21 comprises the circuit board 22, the plurality of electric components 26 mounted on the circuit board 22, and the electric wire connectors 24, 25 mounted on the circuit board 22. The plurality of electric components include an electric component which has a thermal radiating plate 27 to function as an earth terminal. The connector caps 43, 44 are fitted over the electric wire connectors 24, 25.

In the second step, the circuit module 21 is housed in the electric insulating tray 41.

In the third step, the connector caps 43, 44 are exposed to house the tray 41 having the circuit module 21 housed therein in the conductive cover 15.

In the fourth step, the thermal radiating plate 27 that functions as the earth terminal is fixed to the tray 41 and the cover 15, and the cover 15 and the thermal radiating plate 27 are electrically connected together.

In the fifth step, the tray 41 is filled with the filling material 55 having waterproof properties and electric insulation, and the circuit board 22 and the electric components 26 of the circuit module 21 are buried in the filling material 55.

In the sixth step, the housing base 12 and the cover 15 that cover the filling material 55 are connected together.

According to this manufacturing method, it is possible to manufacture the lighting device 5 which has predetermined waterproof properties while grounding the circuit module 21 to the shell case 11 having the housing base 12 and the cover 15.

Figure 15:
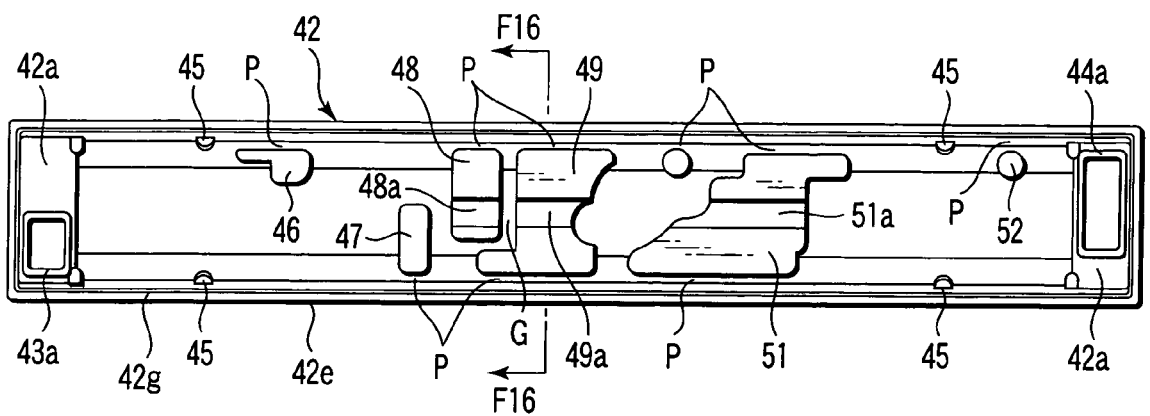
FIG. 15 is a back view showing a tray of a lighting device disposed in a luminaire according to a second embodiment of the present invention.
Figure 16:
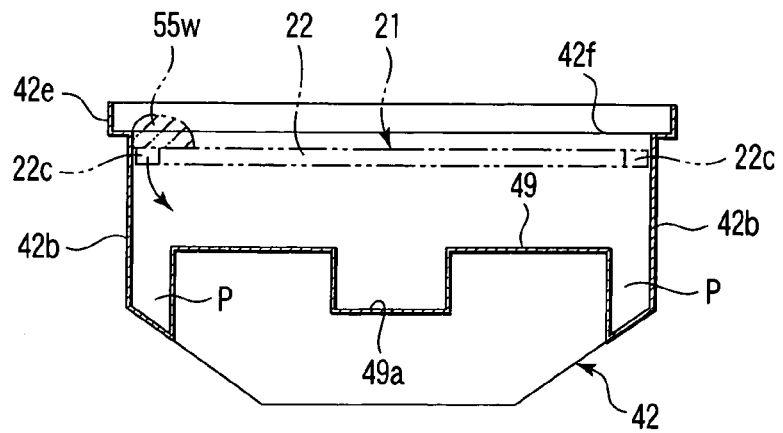
FIG. 16 is a sectional view of the tray shown along the line F16-F16 of FIG. 15.
Figure 17:
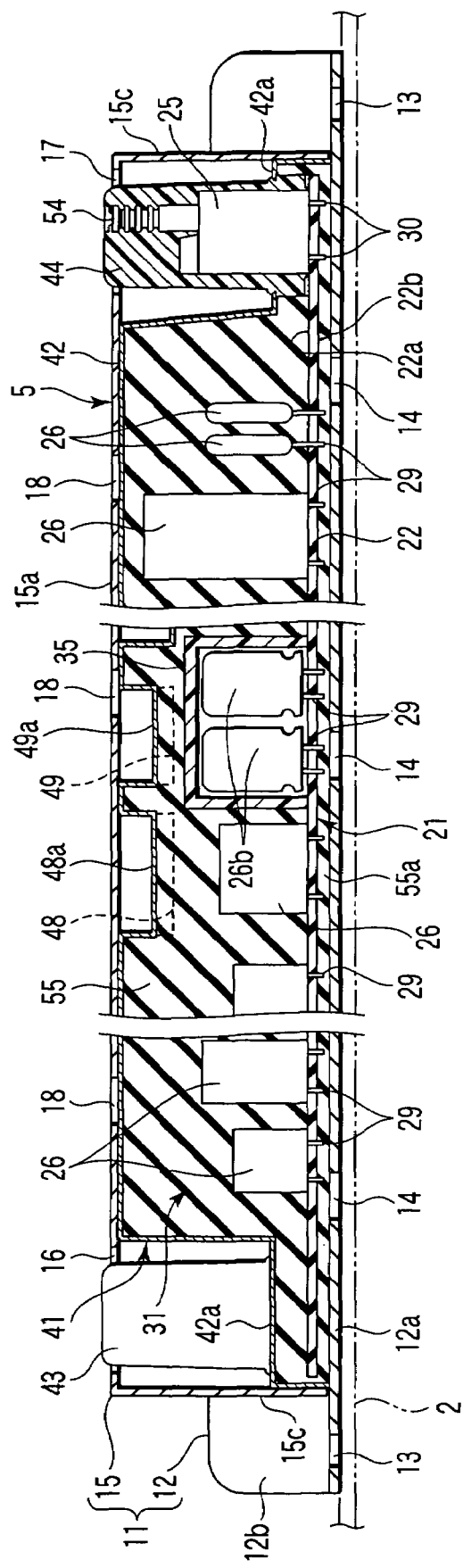
FIG. 17 is a sectional view showing the lighting device according to the second embodiment of the present invention.

FIGS. 15 to 17 show a second embodiment of the present invention. The second embodiment is similar to the first embodiment except for the followings. Accordingly, components identical or functionally similar to those of the first embodiment will be denoted by reference numerals similar to those of the first embodiment, and description thereof will be omitted.

According to the second embodiment, some raised bottoms 48, 49, and 51 individually comprise grooves 48a, 49a, and 51a. Lengths of these raised bottoms 48, 49, and 51 which cross a cover 15 are larger than those of the other raised bottoms.

The groove 48a crosses the raised bottom 48. Both ends of the groove 48a are opened to two among sides of the raised bottom 48. Preferably, as shown in FIG. 15, both ends of the groove 48a are opened to two sides corresponding to a longitudinal direction of a tray 41.

The groove 49a crosses the raised bottom 49. Both ends of the groove 49a are opened to two among sides of the raised bottom 49. Preferably, as shown in FIG. 15, both ends of the groove 49a are opened to two sides corresponding to the longitudinal direction of the tray 41.

The groove 51a crosses the raised bottom 51. Both ends of the groove 51a are opened to two among sides of the raised bottom 51. Preferably, as shown in FIG. 15, both ends of the groove 51a are opened to two sides corresponding to the longitudinal direction of the tray 41.

Components other than the above are similar to those of the first embodiment. Accordingly, the second embodiment provides effects similar to those of the first embodiment, making it possible to achieve the object of the present invention. Moreover, as the raised bottoms 48, 49, and 51 respectively comprise the grooves 48a, 49a, and 51a, the following advantages are provided.

The lengths of the raised bottoms 48, 49, and 51 which cross the cover in a width direction are large. Accordingly, it is easy to block a longitudinal flow of the unhardened filling material 55w inpoured into the tray 41. Thus, as shown in FIG. 15, it is difficult for the filling material 55w to fill a narrow space G between the adjacent raised bottoms 48, 49.

However, the flow-blocked unhardened filling material 55w can move through passages of the grooves 48a, 49a, and 51a in the tray 41. Accordingly, the tray 41 can be easily and surely filled throughout with the filling material 55w. Besides, ends of the grooves 48a, 49a are opened in the space G. Thus, even the space G can be easily and surely filled with the unhardened filling material 55w through the grooves 48a, 49a. In other words, it is possible to prevent the space G from being left as a cavity. As a result, waterproof and insulating reliability of the lighting device 5 is improved.

Figure 18:
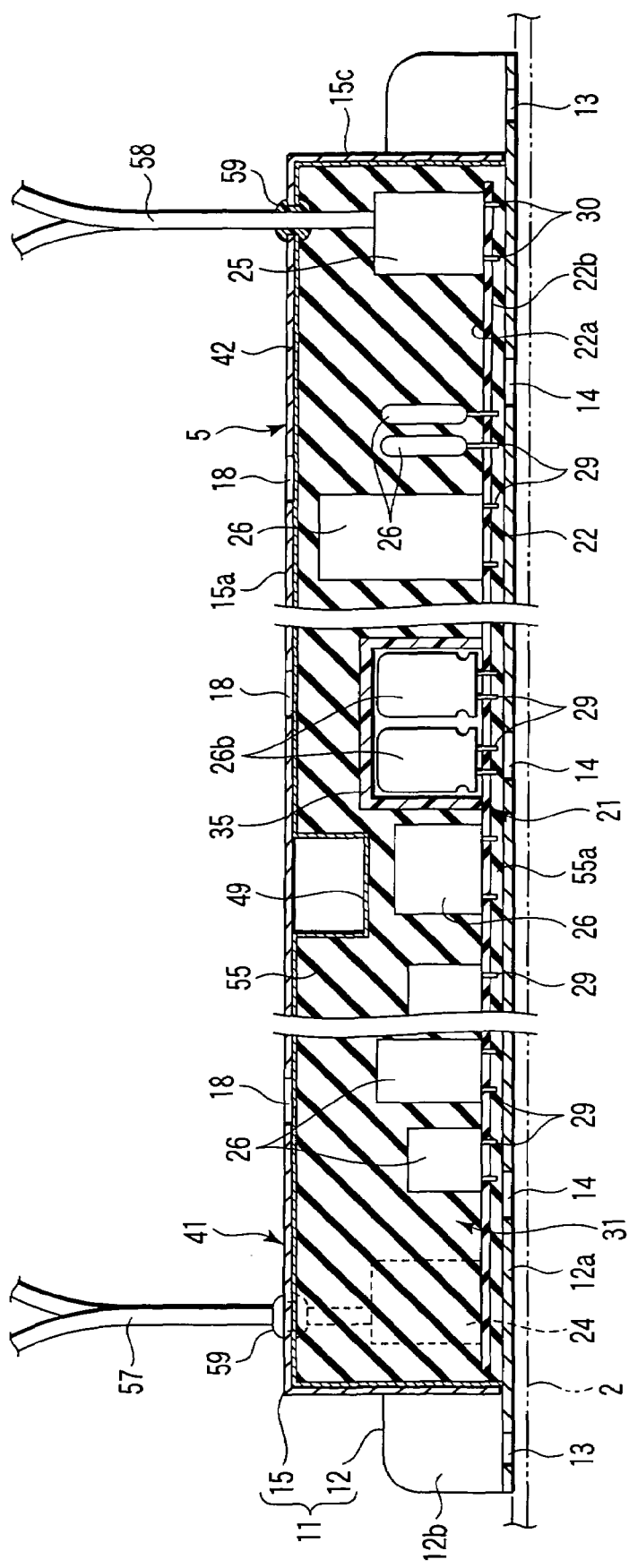
FIG. 18 is a sectional view showing a lighting device disposed in a luminaire according to a third embodiment of the present invention.

FIG. 18 shows a third embodiment of the present invention. The third embodiment is similar to the first embodiment except for the followings. Accordingly, components identical or functionally similar to those of the first embodiment will be denoted by reference numerals similar to those of the first embodiment, and description thereof will be omitted.

According to the third embodiment, both ends of a tray 41 are formed into a depth to house electric wire connectors 24, 25. The connector caps of the first embodiment are not used. Further, a tray main body 42 has no cap connecting section. Insulating covered electric wires 57, 58 are respectively inserted into the electric wire connectors 24, 25 to be connected. These insulating covered electric wires 57, 58 are put through the tray 41 and a cover 15. In these through-portions, bushes 59 made of synthetic rubber or the like are disposed. The bushes 59 protect the insulating covered electric wires 57, 58. Additionally, the bushes 59 prevent leakage of an unhardened filling material to fill the tray 41 through the through-portions.

The insulating covered electric wires 57, 58 are connected to the electric wire connectors 24, 25. The unhardened filling material is inpoured into the tray 41 in a state in which the through-portions of the tray 41 and the cover 15 of the insulating covered electric wires 57, 58 are sealed by the bushes 59. Thus, an entire circuit module 21 that comprises a circuit board 22, electric components 26, and the electric wire connectors 24, 25 is buried in the filling material 55.

Components other than the above are similar to those of the first embodiment. Thus, the third embodiment provides effects similar to those of the first embodiment, making it possible to achieve the object of the present invention.

FIGS. 19 to 22 show a fourth embodiment of the present invention. The fourth embodiment is similar to the first embodiment except for the followings. Accordingly, components identical or functionally similar to the first embodiment will be denoted by reference numerals similar to those of the first embodiment, and description thereof will be omitted.

Figure 19:
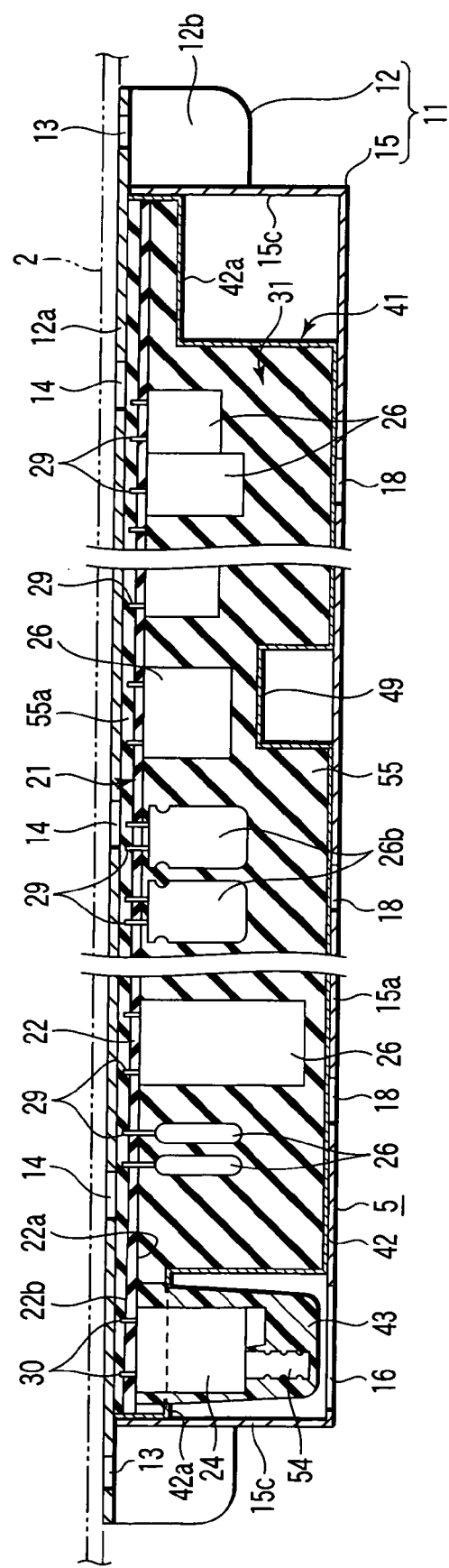
FIG. 19 is a sectional view showing a lighting device disposed in a luminaire according to a fourth embodiment of the present invention.

According to the fourth embodiment, the component cap of the first embodiment is not used. Thus, as shown in FIGS. 19 and 22A, a filling material 55 is brought into direct contact with an electrolytic capacitor 26b mounted on a circuit board 22 to bury the capacitor 26b therein. As shown in FIG. 21, the electrolytic capacitor 26b comprises an explosion-proof valve 28 in its tip surface. The explosion-proof valve 28 is destroyed when inner pressure abnormally increases in the electrolytic capacitor 26b.

Hardness of the filling material 55 heated to be hardened after filling is preferably set to hardness to enable a movement of the explosion-proof valve 28 of the electrolytic capacitor 26b. The explosion-proof valve 28 of the electrolytic capacitor 26b may be destroyed in the filling material 55. In this case, as shown in FIG. 22B, a filing material portion 55d that covers the explosion-proof valve 28 of the electrolytic capacitor 26b can be easily made flexible to rise. Accordingly, stress that accompanies the destruction of the explosion-proof valve 28 is reduced and absorbed. Even when the explosion-proof valve 28 is destroyed, stress of its surrounding filling material 55 is not drastically increased. Thus, there is no possibility that the filling material portion 5d covering the explosion-proof valve 28 will be blown to adversely affect the others.

Additionally, according to the fourth embodiment, electric wire inserting sections 54 of connector caps 43, 44 are formed as follows. That is, each electric wire inserting section 54 comprises a through-hole scheduled section 54c representatively shown in FIG. 20. A plurality of annular projections 54b are disposed in an inner surface of the through-hole scheduled section 54c. The through-hole scheduled section 54c is closed by a closing section 54d which faces a cap outer surface. The closing section 54d is thin.

A core wire and an end exposed to an end of an insulating covered electric wire push broken the closing section 54d to enter the through-hole scheduled section 54c. This insertion is accompanied by tight contact of each annular projection 54b with an outer periphery of the electric wire end, thereby setting a watertight state. The core wire of the electric wire end inserted into the electric wire inserting section 54 is inserted into an electric wire connector, and connected to a quick connection terminal (not shown) of the connector.

The through-hole scheduled section 54c is closed by the thin closing section 54d until the insulating covered electric wire is inserted. Accordingly, even when an unhardened filling material 55 filling the tray 41 spreads from the outside of the connector caps 43, 44 to the through-hole scheduled section 54c, its incursion into the electric wire connectors 24, 25 is prevented.

Components other than the above are similar to those of the first embodiment. Accordingly, the third embodiment provides effects similar to those of the first embodiment, making it possible to achieve the object of the present invention.

FIGS. 23 to 35 show a fifth embodiment of the present invention.

Figure 23:
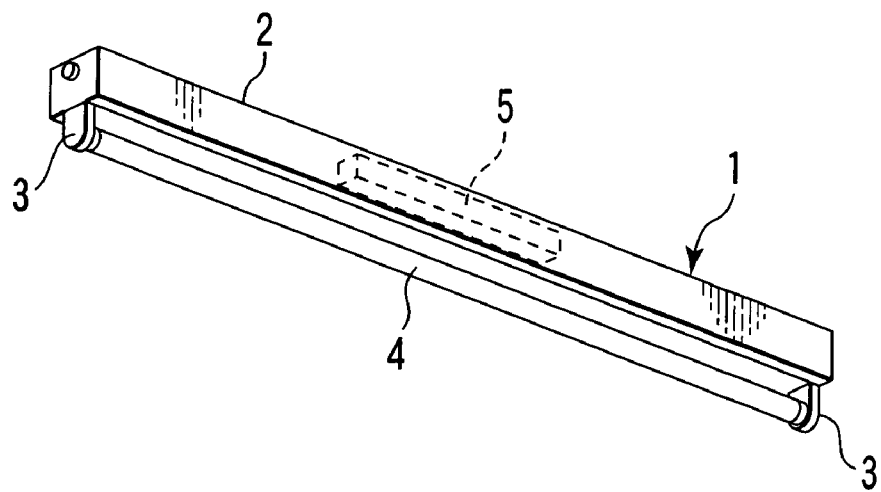
FIG. 23 is a perspective view showing a luminaire according to a fifth embodiment of the present invention.

Referring to FIG. 23, a reference numeral 1 denotes a luminaire which comprises an electronic ballast to function as an electronic apparatus. The luminaire 1 is used as an outdoor lamp, a tunnel lamp installed in a tunnel, a lamp under the eaves of a station house, or the like having preferable waterproof properties. This luminaire 1 comprises a chassis 2, a lamp socket 3, a discharge lamp, a waterproof lighting device 5. For the discharge lamp, for example, a straight tube type fluorescent lamp 4 is used. For the lighting device 5 that lights the fluorescent lamp 4, a waterproof electronic apparatus such as an electronic ballast is used.

The chassis 2 illustrated in FIG. 23 is made of a metal and formed into a rectangular parallelepiped shape. For example, lamp sockets 3 are disposed in both longitudinal ends of the chassis 2 to project downward. The fluorescent lamp 4 is detachably supported by the lamp sockets 3. The lighting device 5 that lights the fluorescent lamp 4 is incorporated in the chassis 2.

Referring to FIGS. 24 to 27, the lighting device 5 comprises a shell case 11, and a waterproof assembly 31. The waterproof assembly 31 comprises a circuit module 21, and a resin member 155.

Figure 26:
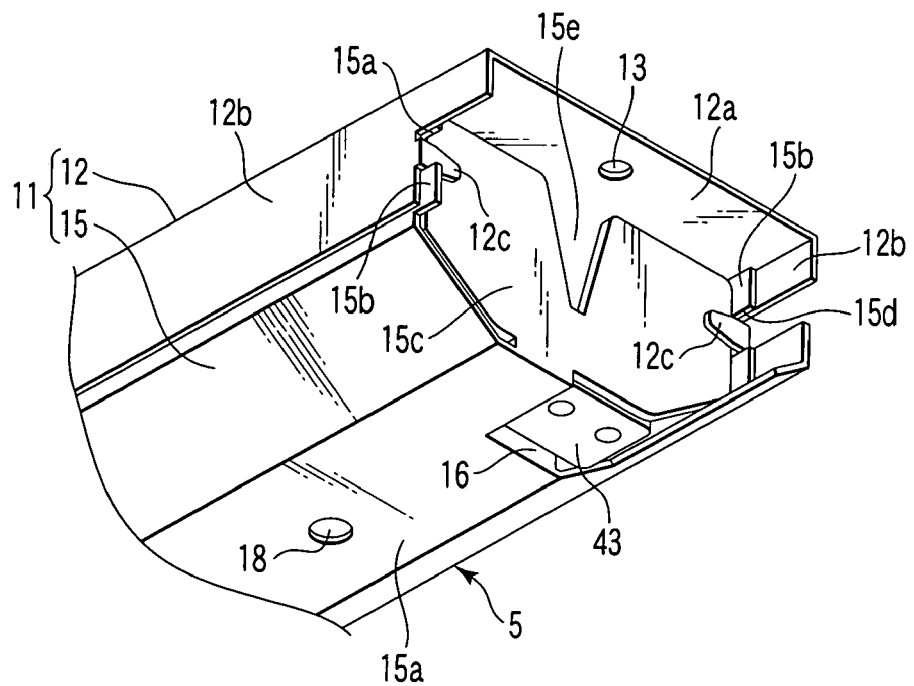
FIG. 26 is an enlarged perspective view showing one end of the lighting device of FIG. 24.

The shell case 11 comprises a housing base 12, and a cover 15 connected thereto. The shell case 11 does not need wateproofing. As shown in FIG. 26, the housing base 12 and the cover 15 are connected to each other by hooking, e.g., a bent section 12c on a receiving section 15d. The bent section 12c is disposed in the housing base 12. The receiving section 15d comprises a recess notch disposed in the cover 15.

The housing base 12 and the cover 15 can be made of synthetic resins. However, to obtain thermal radiation to the outside, preferably, they are made of metals such as aluminum alloys of good thermal radiating properties. Instead, the housing base 12 and the cover 15 can be made of iron metals of low material costs.

Figure 24:
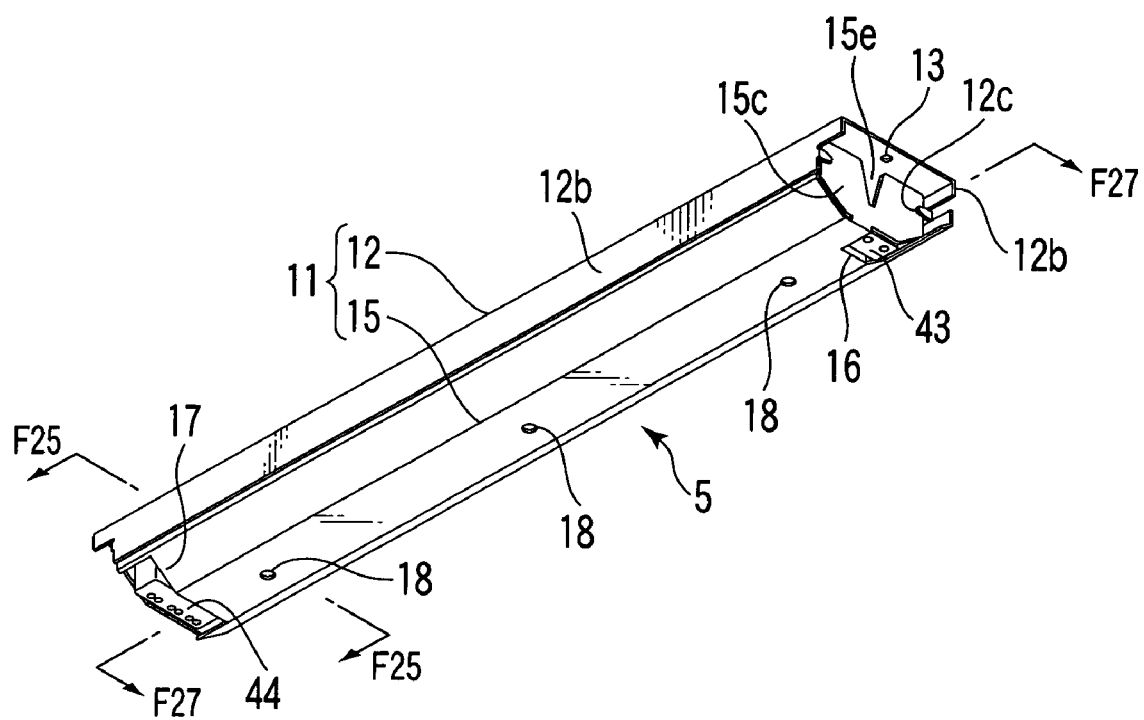
FIG. 24 is a perspective view showing a lighting device disposed in the luminaire of FIG. 23 according to the fifth embodiment.
Figure 25:
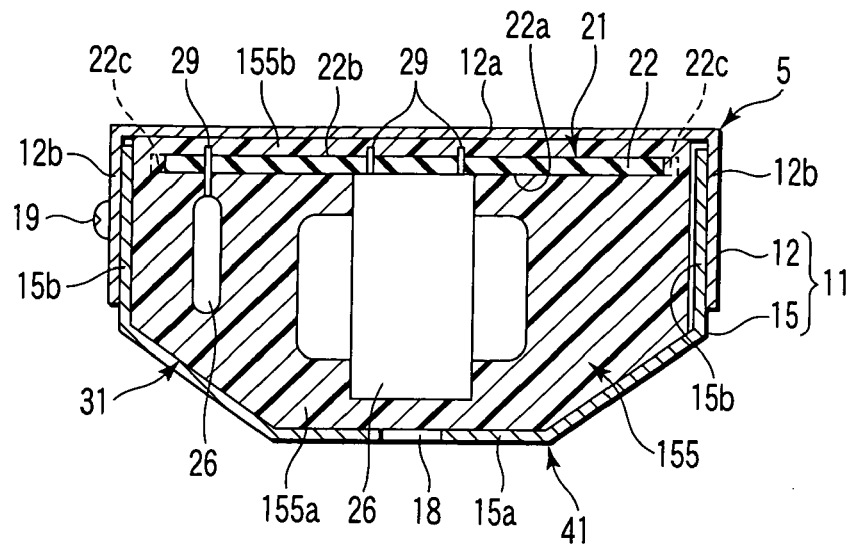
FIG. 25 is a sectional view cut along the line F25-F25 of FIG. 24.

Referring to FIGS. 24 to 26, the housing base 12 comprises a base wall 12a and a side walls 12b. The side walls 12b are bent to be perpendicular from both width-direction ends of the base wall 12a. A total length of the housing base 12 is longer than a circuit board 22 (described later). Fixing sections 13 are formed in both longitudinal ends of the base wall 12a. Each fixing section 13 comprises a hole or a notch. By a fixing component such as a screw through the fixing section 13, the lighting device 5 is mounted to the chassis 2 by bringing the base wall 12a into contact with the chassis 2. The housing base 12 functions as a heat transfer surface to the chassis 2.

Figure 27:
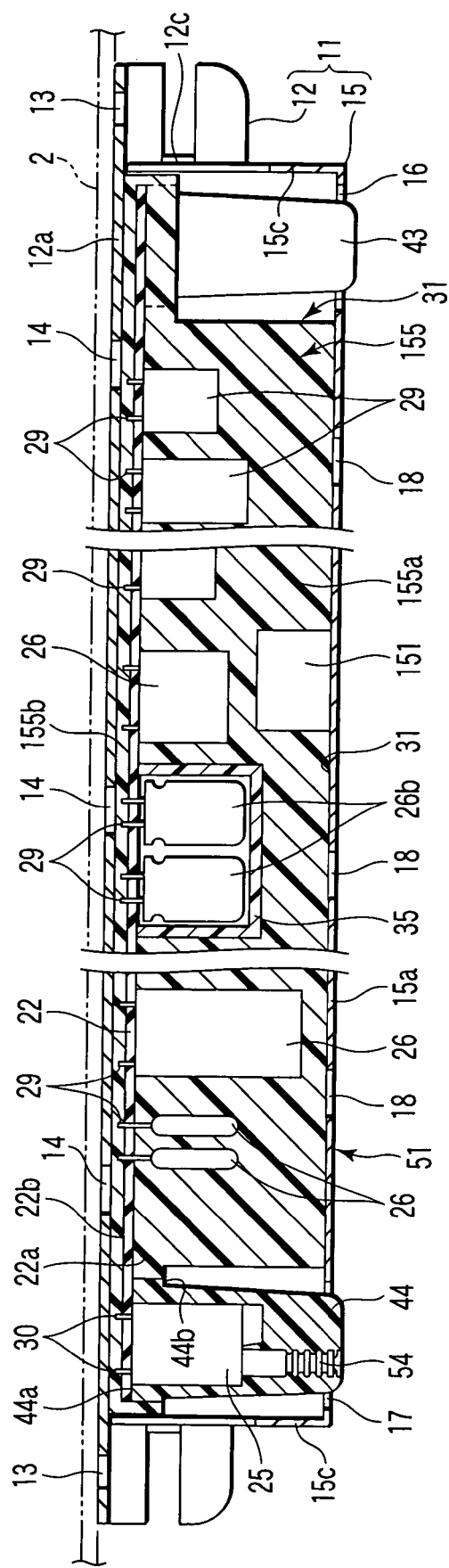
FIG. 27 is a sectional view cut along the line F27-F27 of FIG. 24.
Figure 28:
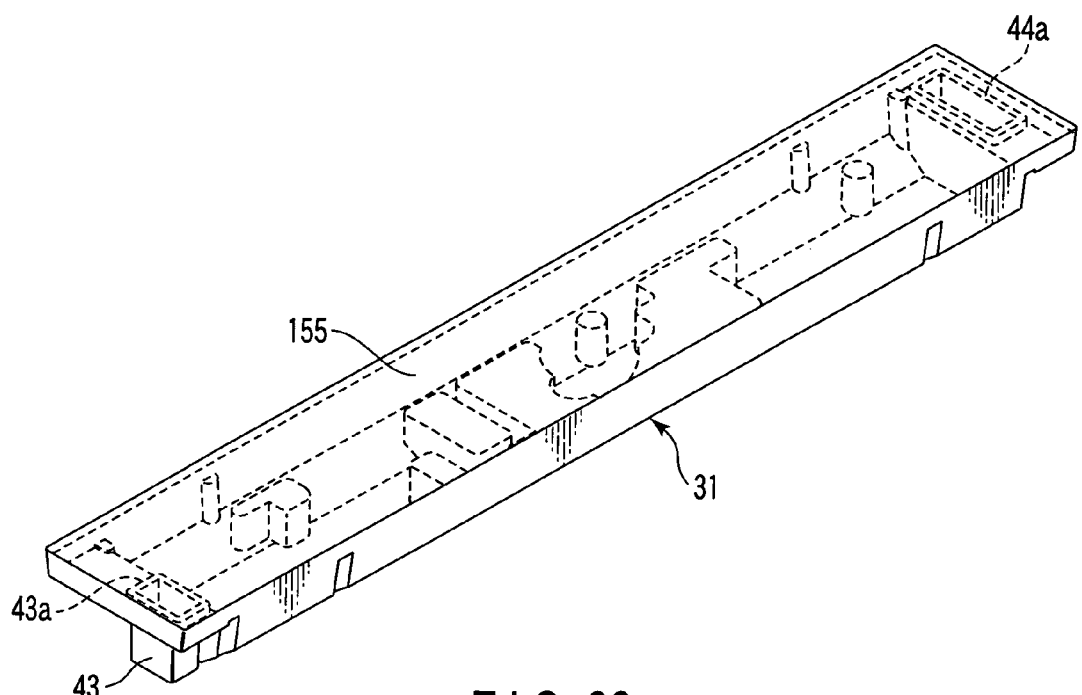
FIG. 28 is a perspective view showing a waterproof assembly of the lighting device of FIG. 24 seen from the back.

Referring to FIGS. 25 to 27, for example, the cover 15 comprises a cover main wall 15a, a side wall 15b, and an end wall 15c. The main cover 15a has obliquely bent portions in both width-direction sides of the cover 15. The side walls 15 are bent from these portions. The cover main wall 15a and the side wall 15b constitute a horizontal gutter structure. The end walls 15c are bent to be perpendicular from both longitudinal ends of the cover main wall 15a. The end walls 15c are disposed to close both longitudinal ends of the horizontal gutter structure. Each end wall 15c has a V-shaped notch 15e. The notch 15e functions as a clearance to suppress interference of a tool head with the end wall 15c.

The cover 15 is formed to be shorter than the housing base 12 to expose the fixing sections 13. The side wall 15b of the cover 15 is in contact with an inner surface of the side wall 12b of the housing base 12. The housing base 12 and the cover 15 can transfer heat through the side walls 12b, 15b in contact with each other.

A hole-shaped section 16 is bored in one longitudinal end of the cover 15. A hole-shaped section 17 is bored in the other longitudinal end of the cover 15. These hole-shaped sections 16, 17 are square. One hole-shaped section 16 is disposed to expose an input connector cap 43. The other hole-shaped section 17 is disposed to expose an output connector cap 44.

The circuit module 21 that lights the fluorescent lamp 4 comprises an electric insulating printed circuit board 22, a lighting circuit 23 (see FIG. 30), an input electric wire connector 24, and an output electric wire connector 25.

The circuit board 22 has electric insulation and a rectangular shape of a size to be housed in the cover 15. One surface of the circuit board 22 is mainly used as a component mounting surface 22a. The other surface of the circuit board 22 is mainly used as, e.g., a soldered surface 22b. A circuit pattern is printed on the soldered surface 22b. The soldered surface 22b is covered with an insulating resist layer (not shown).

Figure 30:
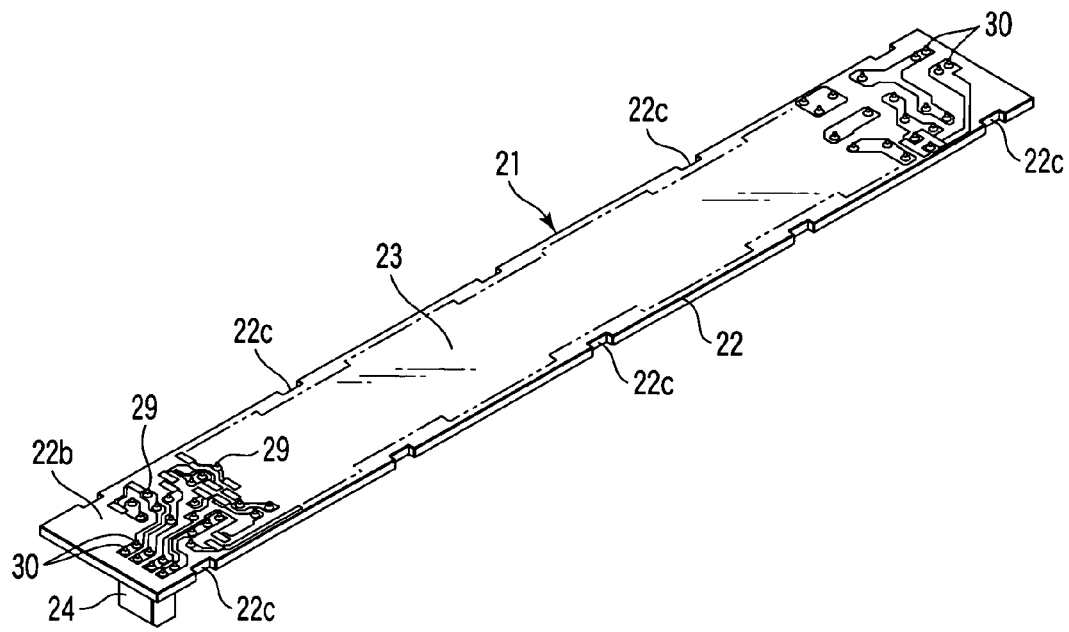
FIG. 30 is a perspective view showing a circuit module disposed in the waterproof assembly of FIG. 28 seen from the back.
Figure 31:
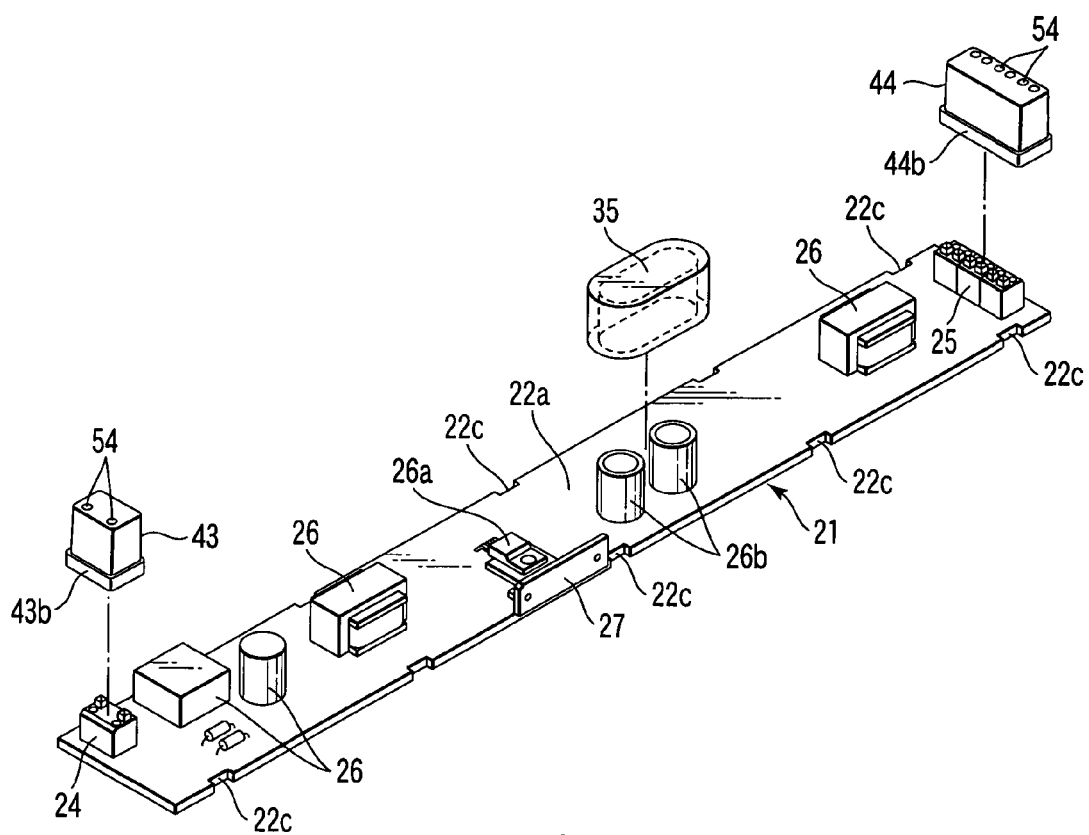
FIG. 31 is a partially exploded perspective view showing the circuit module disposed in the waterproof assembly of FIG. 29 seen from the front.

For example, the circuit board 22 comprises a plurality of notches 22c as passing sections to reach its front and back. As shown in FIGS. 30 and 31 or the like, the notches 22c are disposed in both side edges of the circuit board 22. The notches 22c are kept away from the circuit pattern. The passing sections may be disposed in any places as long as they do not cut off the circuit pattern. The passing sections can be constituted of holes positioned between both side edges of the circuit board 22. Each passing sections can serve both as a hole and a notch. The notch 22c or the through-hole is small, 3 mm or less. However, it is useful for inpouring a resin member 155w when a forming die 65 is filled with the unhardened resin member 155w (described later).

The lighting circuit 23 is constituted by combining the circuit pattern and a plurality of electric components 26 connected thereto (see FIGS. 27 and 31 or the like). For example, the lighting circuit 23 includes an inverter controlled circuit section. As the electric components 26, a semiconductor such as a power transistor, a resistor, a capacitor, a coil, a transformer, a diode, and various other chip components can be cited.

Referring to FIG. 31, a reference numeral 26a denotes a power transistor which is one of the electric components 26, and accompanied by heat generation. A reference numeral 27 denotes a thermal radiating plate thermally connected to the power transistor 26a. The thermal radiating plate 27 also functions as an earth of the lighting circuit 23. The thermal radiating plate 27 is slightly protruded from one side edge of the circuit board. This thermal radiating plate 27 is erected on one side edge of the circuit board 22 to be perpendicular to the component mounting surface 22a.

The lighting circuit 23 is formed over both front and back of a middle portion excluding both longitudinal ends of the circuit board 22. Most of the electric components constituting the lighting circuit 23 are mounted on the component mounting surface 22a. In addition to the surface mounted components such as chip components, the electric components 26 include a plurality of electric components mounted on the circuit board 22 by flow solder processing. Each electric component subjected to the flow solder processing comprises a pin-shaped terminal 29 to penetrate the circuit board 22. By passing the circuit board 22 through a flow solder layer, the terminal 29 is soldered to each land of the circuit pattern to mount the electric component subjected to the flow solder processing on the circuit board 22.

Referring to FIG. 31, the input electric wire connector 24 is soldered to one longitudinal end of the circuit board 22. The output electric wire connector 25 is soldered to the other longitudinal end of the circuit board 22. These electric wire connectors 24, 25 also comprise pin-shaped terminals 30. The electric wire connectors 24, 25 are mounted together with the electric components having the terminals 29 on the circuit board 22 by flow solder processing. A core wire of an insulating covered electric wire (not shown) for a power source side is inserted to be connected to the electric wire connector 24. A core wire of an insulating covered electric wire (not shown) for in-apparatus wiring is inserting to be connected to the electric wire connector 25.

Referring to FIGS. 27 and 31, a reference numeral 35 denotes a component cap. The component cap 35 is made of an electric insulator such as a hard synthetic resin or synthetic rubber. The component cap 35 is disposed over a certain electric component to prevent contact of the resin member 155 with this electric component. The electric component isolated from the resin member 155 by the component cap 35 is an electric component which should not preferably be brought into contact with the resin member 155 to be buried therein. As the electric component of this type, for example, an electrolytic capacitor 26*b* can be cited. The electric component 26 covered with the component cap 35 may or may not be brought into contact with an inner surface of the component cap 35.

An opening surface of the component cap 35 is in contact with the component mounting surface 22*a* of the circuit board 22. Preferably, the component cap 35 is fixed to the component mounting surface 22*a* by an adhesive (not shown). Accordingly, it is possible to obtain a sealing function of holding the component cap 35 on the circuit board 22, and preventing incursion of an unhardened resin member into the component cap 35.

Reference numerals 43, 44 denote connector caps. The connector caps 43, 44 can be made of synthetic resins or rubber. As the synthetic rubber of the connector caps 43, 44, ethylene propylene rubber (EPDM) can be cited. One connector cap 43 is elastically deformed to cover the input electric wire connector 24 tightly and be coupled to. The other connector cap 44 is elastically deformed to cover the output electric wire connector 25 tightly and be coupled to.

Open end surfaces 43*a*, 44*a* of the connector caps 43, 44 are in contact with the component mounting surface 22*a* of the circuit board 22. Preferably, the connector caps 43, 44 are fixed to the component mounting surface 22*a* by an adhesive (not shown). Accordingly, the connector caps 43, 44 and the circuit board 22 are sealed from each other to prevent incursion of the unhardened resin member into the connector caps 43, 44. As shown in FIGS. 27 and 31, outer peripheral surface of the connector caps 43, 44 comprise stepped sections 43*b*, 44*b*. The stepped sections 43*b*, 44*b* are formed near the open end surfaces 43*a*, 44*a*.

Referring to FIGS. 27 and 31, each of the connector caps 43, 44 comprises a plurality of electric wire inserting sections 54. An end of the insulating covered electric wire for the power source or the in-apparatus wiring in the apparatus is inserted into the electric wire inserting section 54. The electric wire inserting section 54 has a thin portion 54*a* in which a small hole is bored. A plurality of annular projections (not shown) are disposed in an inner surface of the electric wire inserting section 54.

A core wire and an end exposed to the end of the insulating covered electric wire are pushed through the thin portion to be inserted into the electric wire inserting section 54. This insertion brings an outer periphery of the electric wire end into tight contact with each annular projection to improve watertightness. The core wire of the electric wire end inserted into the electric wire inserting section 54 is inserted into the electric wire connector 24 or 25. The inserted core wire is inserted into a terminal (not shown) incorporated in the electric wire connector 24 or 25, and electrically and mechanically connected to the terminal. The terminal is connected to the circuit pattern.

The resin member 155 is made of a synthetic resin or the like having electric insulation and waterproof properties. According to the embodiment, a urethane resin mixed with a filler (not shown) is used. For the filler, an inorganic material such as aluminum oxide is suitably used. The mixing of the filler is preferable because it improves thermal radiating properties of the resin member 155. The circuit board 22 and the electric components 26 are buried in the resin member 155.

Referring to FIGS. 25 and 27, the resin member 155 comprises a component cover layer 155*a* and a back cover layer 155*b*. The component cover layer 155*a* and the back cover layer 155*b* are integrally connected. The component cover layer 155*a* covers the component mounting surface 22*a* of the circuit board 22. The back cover layer 155*b* covers a soldered surface 22*b* which constitutes a back of the circuit board 22.

Figure 29:
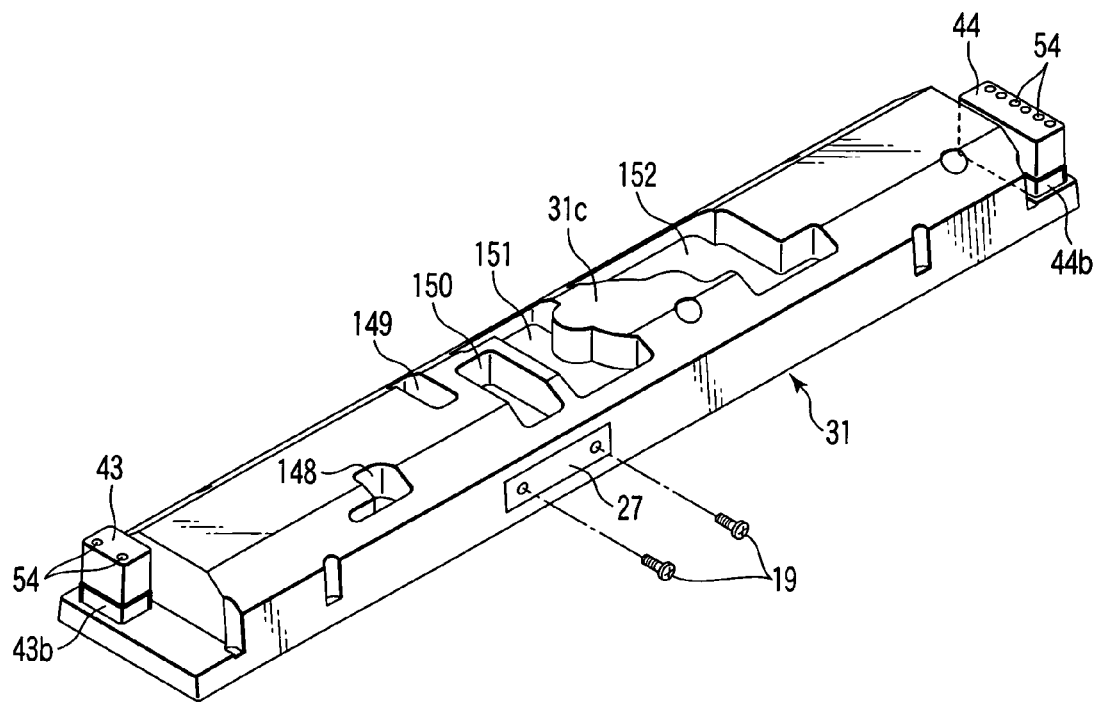
FIG. 29 is a perspective view showing the waterproof assembly of the lighting device of FIG. 24 seen from the front.

Referring to FIGS. 27 and 29, recess sections 148 to 152 are formed in the component cover layer 155*a*. For example, the recess sections 148 to 152 concentrate in a longitudinal center of the component cover layer 155*a*. These recess sections 148 to 152 are concaved toward the component mounting surface 22*a*. The recess sections 148 to 152 are disposed corresponding to an area in which an arrangement density of the electric components 26 of the circuit module 21 is low, an area in which electric components of low heights such as chip components concentrate, or the like.

Thus, the component cover layer 155*a* is rough. This roughness corresponds to the arrangement, height or the like of the electric components 26. Preferably, a rough section 31*c* (see FIG. 29) of the component cover layer 155*a* is shaped in conformity with the electric components 26 mounted on the component mounting surface 22*a* and having different heights. Accordingly, the amount of using the resin member 155 can be reduced more. On a side face of the component cover layer 155*a*, a thermal radiating plate 27 is exposed on one surface as shown in FIG. 29.

Terminals 29, 30 are buried in the back cover layer 155*b*. A surface of the back cover layer 155*b* is preferably planar. However, this surface can be formed in accordance with a shape of a member with which it comes into contact. Further, the back cover layer 155*b* may have a groove or hole-shaped recess to open on its surface.

A method of manufacturing the waterproof assembly 31 will be described with reference to FIGS. 32 to 35. This method comprises a setting step, a filling step, a hardening step, and a releasing step.

In the setting step, the circuit module 21 is set in the forming die 65 shown in FIGS. 32 to 35. Before this setting, the component cap 35 is mounted to the component mounting surface 22*a* to cover the electrolytic capacitor 26*b*. Further, the connector cap 43 has been fitted over the electric wire connector 24. Similarly, the connector cap 44 has been fitted over the electric wire connector 25.

The forming die 65 is made of a metal, and its upper surface is open. A shape of this opening is size larger than the circuit board 22. In a bottom of the forming die 65, a plurality of convex sections 58 to 62 are formed to be directed upward. The convex sections 58 to 62 are respectively disposed corresponding to the recess sections 148 to 152. Board setting sections 63, 64 are formed in both longitudinal ends of the forming die 65. The board setting sections 63, 64 are higher than the convex sections 58 to 62.

A set hole 63a is bored in an upper wall of the board setting section 63. Similarly, a set hole 64a is bored in an upper wall of the board setting section 64. The set hole 63a is smaller than a stepped section 43b of the connector cap 43. A cap portion other than the stepped section 43b of the connector cap 43 can be inserted through the set hole 63a. Similarly, the set hole 64a is smaller than a stepped section 44b of the connector cap 44. A cap portion other than the stepped section 44b of the connector cap 44 can be inserted through the set hole 63a.

In the setting step, the circuit module 21 is arranged in the forming die 65 while the component mounting surface 22a is downward. In this case, the connector cap 43 is inserted into the set hole 63a, and the connector cap 44 is inserted into the set hole 64a. Then, the set hole 63a is covered with the stepped section 43b of the connector cap 43. Similarly, the set hole 64a is covered with the stepped section 44b of the connector cap 44.

Thus, both ends of the circuit board 22 are supported on the board setting sections 63, 64 by using the stepped sections 43b, 44b as spacers. Accordingly, the circuit module 21 is positioned in a predetermined position of the forming die 65. In this state, the convex sections 58 to 62 of the forming die 65 face an area in which an arrangement density of the electric components 26 of the circuit module 21 is small, and an area in which the electric components of low heights such as chip components concentrate.

Figure 33:
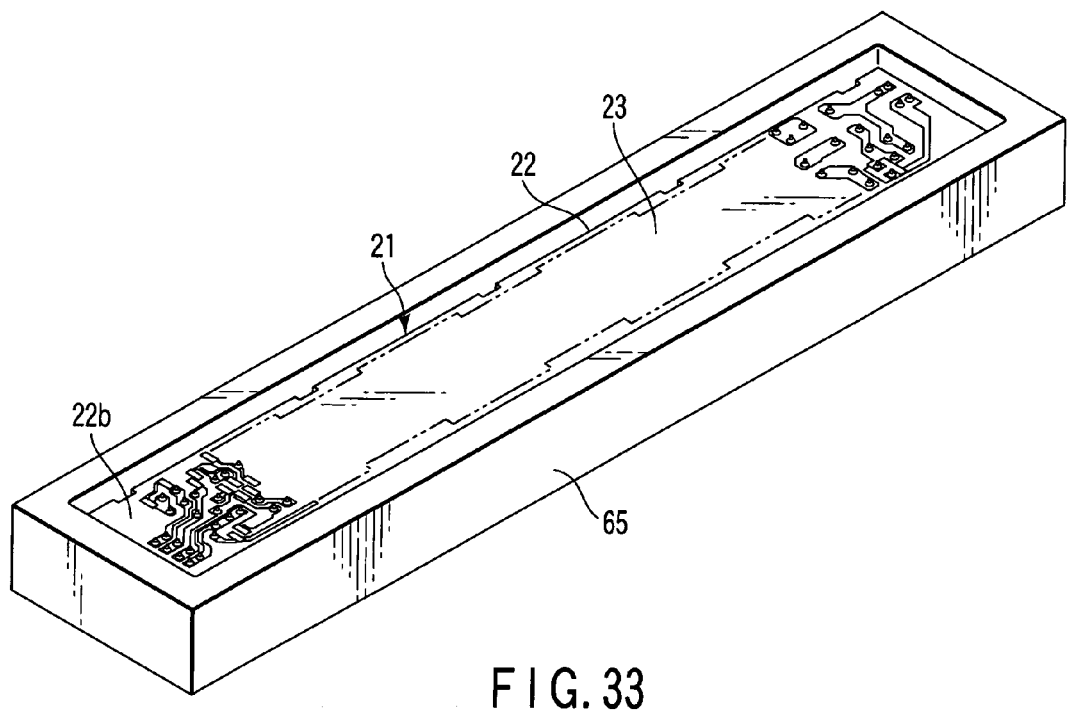
FIG. 33 is a perspective view showing a state in which the circuit module of FIG. 30 is set in the forming die of FIG. 32.

Thus, the circuit module 21 is housed in the forming die 65. Tips of the terminal 29 of the electric components 26 of the circuit module 21 and the terminal 30 of the electric wire connectors 24, 25 are directed upward to project from the soldered surface 22b of the circuit board 22. However, the soldered surface 22b, and the terminals 29, 30 are arranged lower than the upper surface of the forming die 65. This state is shown in FIG. 33.

In the next filing step, the unhardened resin member 155w (see FIG. 34) is inpoured through a space between an edge of the upper surface opening of the forming die 65 and the circuit board 22, especially a notch 22c.

An opening for flowing of the unhardened resin member 155w to a lower side of the circuit board 22 is formed larger than the other gaps by the notch 22c. This inpouring facilitates flowing of air of the lower side of the circuit board 22 through another notch 22c not used for the inpouring. Accordingly, even the unhardened resin member 155w having certain viscosity can be smoothly inpoured to fill the forming die 65. Thus, filling time of the unhardened resin member 155w is shortened to contribute to a cost reduction.

As described above, substitution of the unhardened resin member 155w for air is good, whereby a filling failure can be suppressed. In other words, it is possible to prevent formation of a cavity caused by residual air between the component mounting surface 22a and the forming die 65. If a cavity is left in the resin member 155, there is a possibility that moisture will stay therein. This is not preferable from the standpoint of waterproofing and insulation.

The notch 22c not used for the filling with the unhardened resin member 155w is used as a return passage of an extra portion of the inpoured resin member 155w. Through this return passage, the inpoured resin member reversely flows from the lower side of the circuit board 22 to its upper side.

Figure 34:
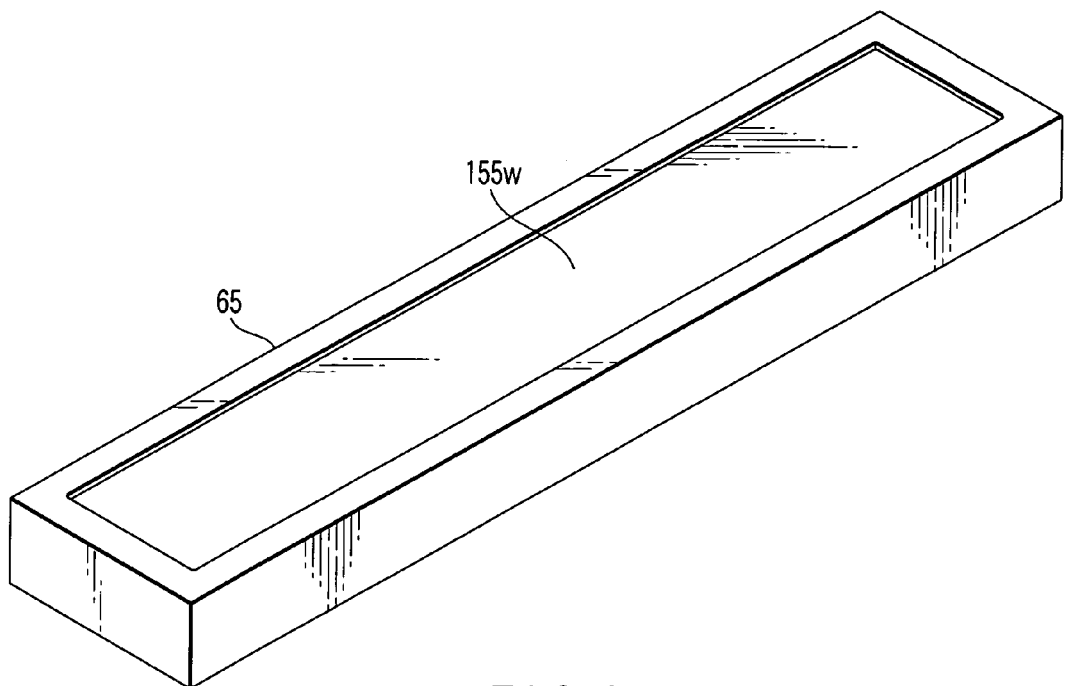
FIG. 34 is a perspective view showing a state in which a resin member is injected into the forming die of FIG. 33.

Thus, the soldered surface 22b is covered with the unhardened resin member 155w. This state is shown in FIG. 34.

In the aforementioned filling, use of an unhardened resin member 155w subjected to defoaming beforehand is preferable. Further, it is advised to execute defoaming for an unhardened resin member 155w about to be inpoured into the forming die 65, or an unhardened resin member 155w inpoured into the forming die 65. The defoaming is executed by putting the unhardened resin member 155w in a pressure-reduced atmosphere. By this defoaming, it is possible to prevent formation of a cavity caused by residual bubbles in the hardened resin member 155.

During the filling, the electrolytic capacitor 26b is isolated from the unhardened resin member 155w with which the forming die 65 has been filled by the component cap 35 covering the capacitor. In other words, the resin member 155w that has filled the forming die 65 is prevented from coming into contact with the electrolytic capacitor 26b to bury the same. Accordingly, there is no possibility that the resin member hardened as describe later will cause a functional reduction of the electrolytic capacitor 26b. Thus, the electrolytic capacitor 26b can exhibit a desired function.

In the next hardening step, the forming die 65 into which the predetermined amount of the unhardened resin member 155w has been inpoured is passed through a heating hardening furnace (not shown) to harden the unhardened resin member 155w. By this hardening processing, the waterproof assembly 31 that comprises the circuit module 21 and the hardened resin member 155 having the same buried therein is formed.

Figure 35:
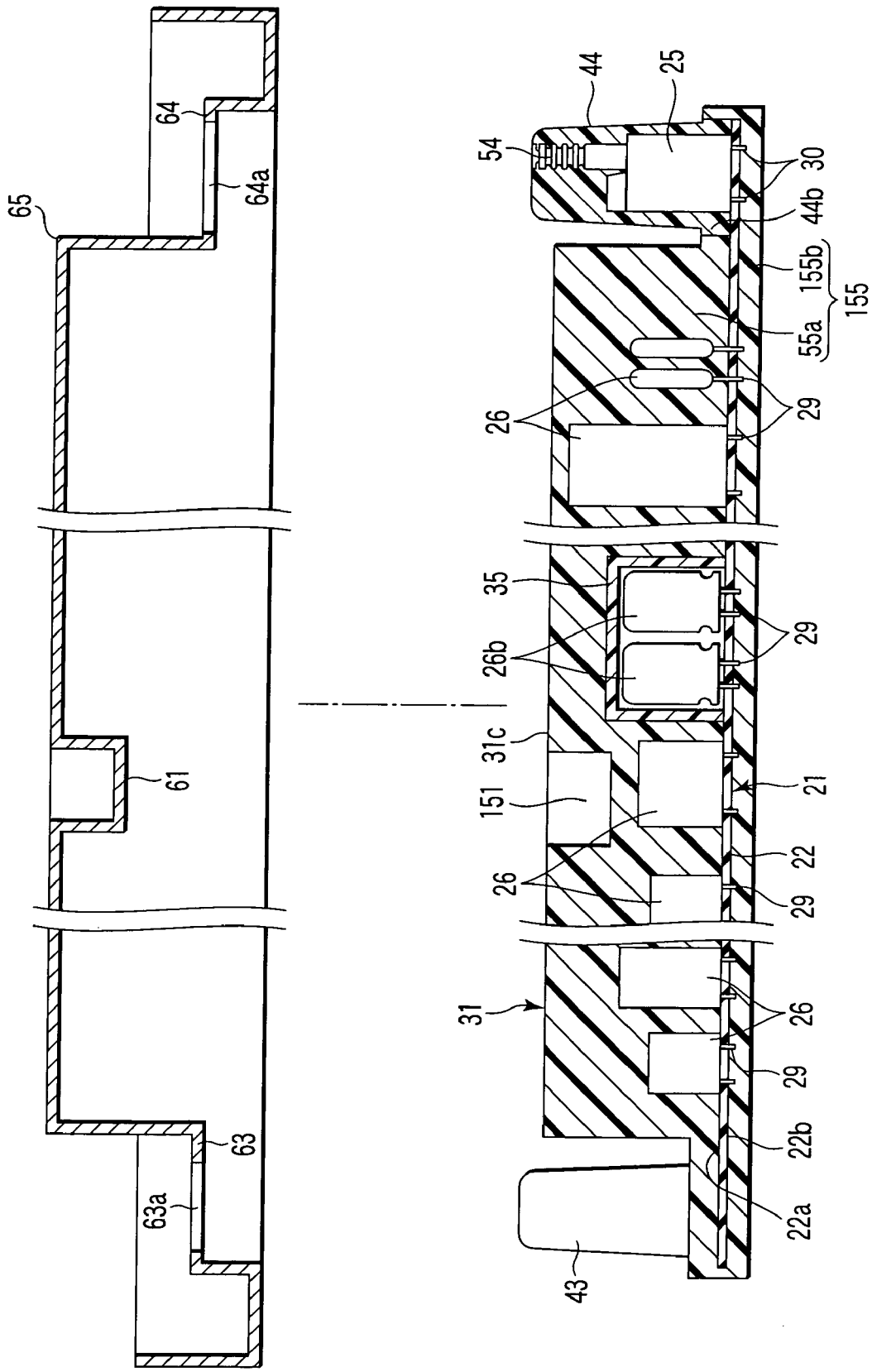
FIG. 35 is a sectional view showing the forming die of FIG. 32 and the waterproof assembly released therefrom.

In the last releasing step, the waterproof assembly 31 is taken out of the forming die 65. This releasing work is carried out by turning over the forming die 65, and pushing the connector caps 43, 44 projected from the back of the forming die 65 into the same. Accordingly, the waterproof assembly 31 is extruded from the forming die. This state is shown in FIG. 35. To facilitate the releasing work, preferably, a releasing agent is applied beforehand on an inner surface of the forming die 65 in the setting step.

According to the manufacturing method, to facilitate the releasing of the waterproof assembly 31 from the forming die, a forming die of a divisive type can be used. The forming die of the divisive type comprises a plurality of die elements. These die elements are moved to enable die clamping or opening.

For the resin member 155 of the waterproof assembly 31 thus manufactured, its component cover layer 155a has recess sections 148 to 152. Accordingly, as compared with a configuration of no recess sections, the amount of using the resin member 155 is small. Thus, the waterproof assembly 31 can be made light, but also filling time can be shortened. As a result, it is possible to reduce costs of the lighting device 5 and the luminaire 1 which comprises the same.

In the manufactured waterproof assembly 31, the circuit module 21 excluding the electric wire connectors 24, 25 is buried in the resin member 155. The resin member 155 having the circuit board 22 and the electric components 26 buried therein is electric insulating, waterproof, and flexible. Accordingly, the waterproof properties of the resin member 155 enables waterproofing of the circuit board 22, the electric components 26, the soldered surface 22b and the like of the circuit module 21.

In the manufactured waterproof assembly 31, the circuit module 21 is completely buried in the resin member 155. Accordingly, the electric components 26 and the soldered surface 22b are protected from clashing of other articles. Thus, handling or the like of the waterproof assembly 31 after the manufacturing is easy. The back cover layer 155*b* of the molded resin member 155 adheres to solder on the soldered surface 22*b* to cover the same. As a result, even when the waterproof assembly 31 is bent, it is possible to suppress peeling of the solder from the soldered surface 22*a* by the back cover layer 155*b*.

The waterproof assembly 31 is housed in the shell case 11 as shown in FIGS. 25 and 27. In this housed state, the component cover layer 155*a* is in contact with a base wall 12*a* of the housing base 12. Additionally, the back cover layer 155*b* is in contact with a cover main wall 15*a* of the cover 15. The waterproof assembly 31 is drawn to be fixed to one side of the shell case 11 by a fixing member such as a metal screw 19 (see FIGS. 25 and 29).

The screw 19 is passed through one side of the cover 15 and one side wall 12*b* of the housing base 12 stacked thereon to be screwed into the thermal radiating plate 27. In this screwed portion, the cover 15 and the housing base 12 are connected together. The screw 19 electrically connects the cover 15 to the thermal radiating plate 27 which functions as an earth terminal. Thus, the circuit module 21 is grounded to the shell case 11 via the screw 19.

The shell case 11 functions as an electromagnetic wave shielding member, a mechanical protective member, or the like for the waterproof assembly 31 housed therein.

The resin member 155 of the lighting device 5 is not only waterproof but also thermal radiative. Accordingly, heat of the electric components due to heat generation of a power transistor 26*a* or the like can be transferred through the resin member 155 to the shell case 11. In this case, a heat transfer area from the resin member 155 to the shell case 11 is large. Besides, as a capacity of the resin member 155 is large, good thermal radiating properties can be obtained.

That is, the back cover layer 155*b* of the resin member 155 is in surface-contact with the cover 15 with respect to the shell case 11. Additionally, drawing of the screw 19 is accompanied by surface contact of one side face of the resin member 155 with one side of the shell case 11. Thus, heat can be transferred from the resin member 155 of the waterproof assembly 31 to the shell case 11.

Besides, the resin member 155 has good thermal radiating properties from its surface. The resin member 155 comprises the recess sections 148 to 152, whereby its surface area is increased. Accordingly, heat can be radiated well from the resin member 155 to the shell case 11. Especially, by employing the resin member 155 mixed with an inorganic filler, it is possible to improve thermal radiating properties.

As described above, the heat of the shell case 11 is discharged to the chassis 2. Thus, it is possible to suppress a temperature increase of the circuit module 21 caused by heat generated by the power transistor 26*a* of much heat generation.

The resin member 155 of the waterproof assembly 31 is in contact with the metal shell case 11. However, the resin member 155 has electric insulation. Accordingly, irrespective of the contact, no member is necessary to realize electric insulation between the shell case 11 and the circuit module 21. Thus, it is possible to reduce the number of components and the number of assembling steps.

As the waterproof assembly 31 itself has a waterproof structure to endure a highly humid environment, no large waterproof case is necessary to house the shell case 11. Accordingly, time and labor of housing the lighting device 5 in the waterproof case, and time and labor of subsequently assembling the waterproof case are not necessary. Thus, the lighting device 5 can be easily assembled. Besides, the use of the waterproof case itself can prevent a cost increase. Additionally, assembling costs can be reduced. As a result, it is possible to reduce costs of the lighting device 5 and the luminaire 1 which comprises the same. Moreover, the shell case 11 that houses the waterproof assembly 31 does not need any waterproof structure. Thus, the shell case 11 can be easily assembled.

Drainage sections are disposed in the housing base 12 of the shell case 11 and the cover 15. In other words, as shown in FIGS. 24 to 26, a plurality of drainage sections 14 are made in the base wall 12*a* of the housing base 12. Associatively, a plurality of drainage sections 18 are made in the cover main wall 15*a* of the cover 15. These drainage sections 14, 18 comprise holes.

Humidity or the like may cause dew condensation between the shell case 11 and the resin member 155 of the waterproof assembly. In this case, dew condensation water can be discharged through the drainage sections 14, 18 to the outside of the shell case 11. Accordingly, electric insulation of the lighting device 5 can be improved. Such drainage is effective for suppressing occurrence of rust in the shell case 11 when the shell case 11 is made of an iron metal.

The existing paths of heat transfer are all made of metal components. Accordingly, the heat-transfer path can also server as an earth path from the circuit module 21 to the chassis 2. The earth can be secured as follows. For example, an earth line is disposed in the circuit pattern formed in the circuit board 22. This earth line is connected to the electric wire connector 25. An earth wire is inserted to be connected to the electric wire connector 25.

As the circuit module 21 is buried in the resin member 155 as described above, dust can be surely prevented by the resin member 155. Thus, the configuration is suitable for the lighting device 5 used in a place of much dust, and the dustproof luminaire 1 which comprises the same.

The lighting device 5 as the electronic apparatus is manufactured through the setting step, the filling step, the hardening step, and the releasing step.

In the setting step, the circuit module 21 is arranged. The circuit module 21 comprises the circuit board 22, and the plurality of electric components 26 mounted on one surface (surface 22*a*) of the circuit board 22 to constitute an electric circuit in the forming die 65 having an opened upper surface and the recess and convex sections 58 to 62 formed in the bottom. In the setting step, the one surface is set downward. The other surface (back 22*b*) of the circuit board 22 arranged in the forming die 65 is lower than its upper surface.

In the filling step, the unhardened waterproof resin member 155*w* is inpoured into the forming die 65. Accordingly, the circuit module 21 is buried in the resin member 155*w*.

In the hardening step, the resin member 155*w* in the forming die 65 is hardened. Accordingly, the lighting device (electric apparatus) 5 that comprises the circuit module 21 and the hardened resin member 115 having the module buried therein is formed.

In the releasing step, the lighting device (electronic apparatus) 5 is taken out of the forming die 65.

According to this manufacturing method, it is possible to manufacture the lighting device (electronic apparatus) 5 which includes the circuit module 21 and the resin member 155. The resin member 155 comprises the component cover layer 155*a* and the back cover layer 155*b*. The component cover layer 155*a* covers one surface (surface 22*a*) of the circuit board 22 on which the plurality of electric components constituting the electric circuit are mounted. The component cover layer 155*a* has recess sections 148 to 152 concaved toward the one surface (surface 22*a*). The back cover layer 155*b* cover the other surface (back 22*b*) of the circuit board 22. Accordingly, the manufactured lighting device (electronic apparatus) 5 is waterproof, thermal radiative, and light as described above.

Preferably, the lighting device 5 is housed in the shell case 11 which comprises the housing base 12 and the cover 15. In this case, it is advised to fix the circuit module 21 to the cover 15 by a screw 19. Thus, it is possible to manufacture the lighting device (electronic apparatus) 5 which comprises the shell case 11 having predetermined waterproof properties while grounding the circuit module 21.

Figure 36:
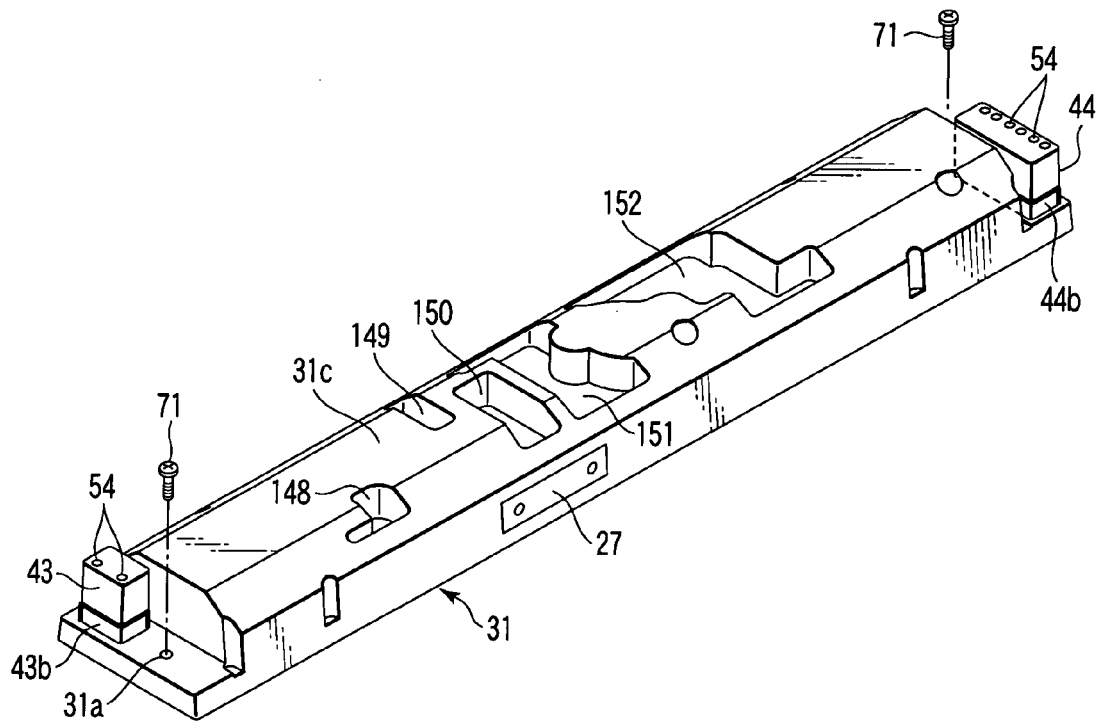
FIG. 36 is a perspective view showing a lighting device of a luminaire seen from the front according to a sixth embodiment of the present invention.
Figure 37:
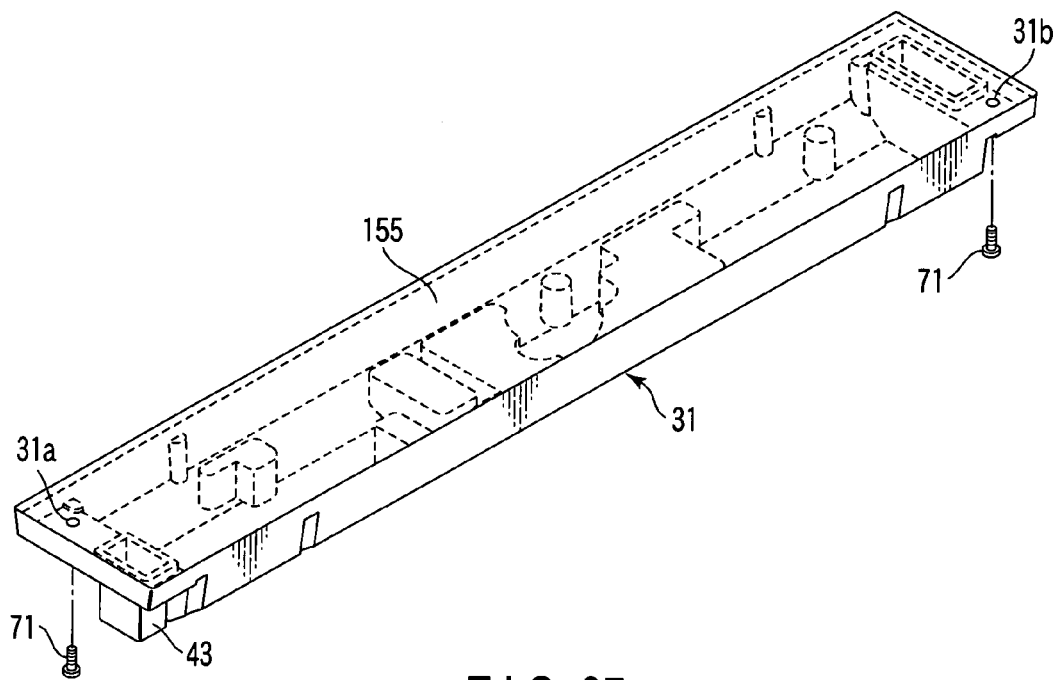
FIG. 37 is a perspective view showing the lighting device of FIG. 36 seen from the back.
Figure 38:
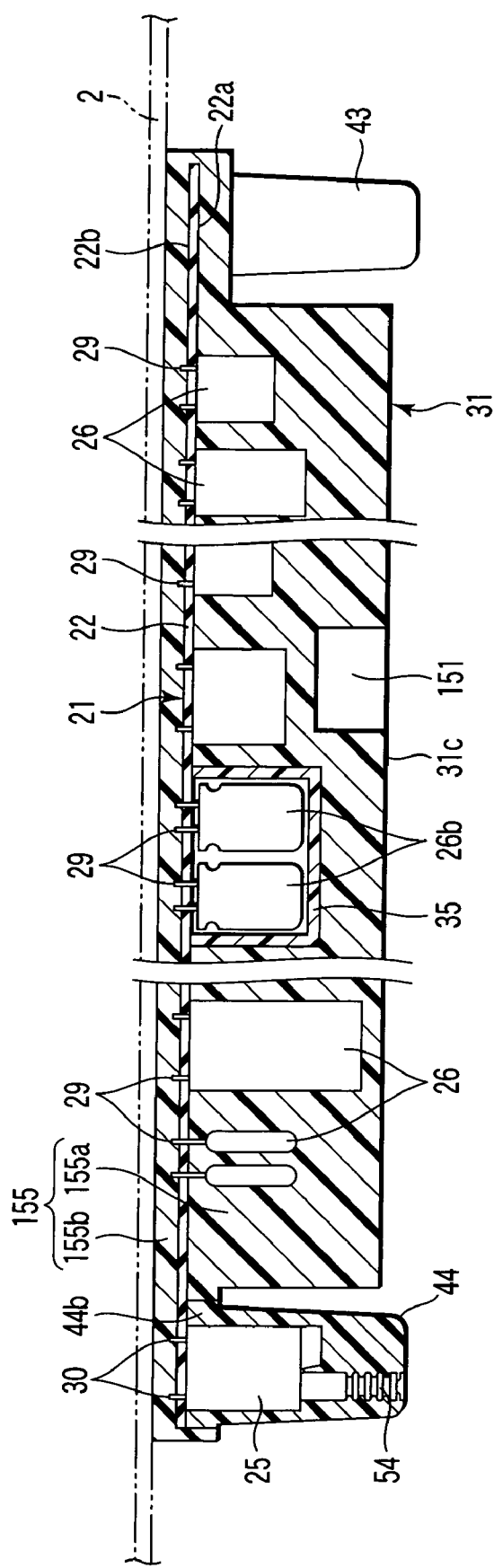
FIG. 38 is a sectional view showing the lighting device of FIG. 36.

FIGS. 36 to 38 show a sixth embodiment of the present invention. The sixth embodiment is similar to the fifth embodiment except for the followings. Accordingly, components identical or functionally similar to those of the fifth embodiment will be denoted by reference numerals similar to those of the fifth embodiment, and description thereof will be omitted.

According to the sixth embodiment, a waterproof assembly 31 itself functions as a lighting device which is an electronic apparatus. Thus, the shell case used in the fifth embodiment is not used. As shown in FIGS. 36 and 37, the waterproof assembly 31 comprises a plurality of through-holes 31a, 31b. The through-hole 31a is disposed near a connector cap 43. The through-hole 31b is disposed near a connector cap 44. These through-holes 31a, 31b are disposed by post-processing.

Screws 71 are inserted into the through-holes 31a, 31b. These screws 71 are screwed into a chassis 2. Accordingly, the waterproof assembly 31 is directly mounted to the chassis 2. This mounting brings a back cover layer 155b of the waterproof assembly 155b into tight contact with the chassis 2. Thus, the back cover layer 155b is used as a heat-transfer section to the chassis 2.

Components other than the above are similar to those of the fifth embodiment. Thus, the sixth embodiment provides effects similar to those of the fifth embodiment, thereby achieving the object of the present invention. Besides, since no shell case is used, the number of components can be reduced to enable a further cost reduction. A surface of the waterproof assembly 31 is exposed. Accordingly, thermal radiation from a surface of a resin member 155 is improved. Thus, by this thermal radiation and the heat transfer from the back cover layer 155b to the chassis 2, it is possible to suppress a temperature increase of a circuit module 21.

The resin member 155 is flexible. Accordingly, when an electronic apparatus mounting surface of the chassis 2 is bent, the waterproof assembly 31 can associatively be bent. When the waterproof assembly 31 is directly mounted to the bent electronic apparatus attaching surface, a pressing member for maintaining bending of the waterproof assembly 31 is preferably used.

Figure 39:
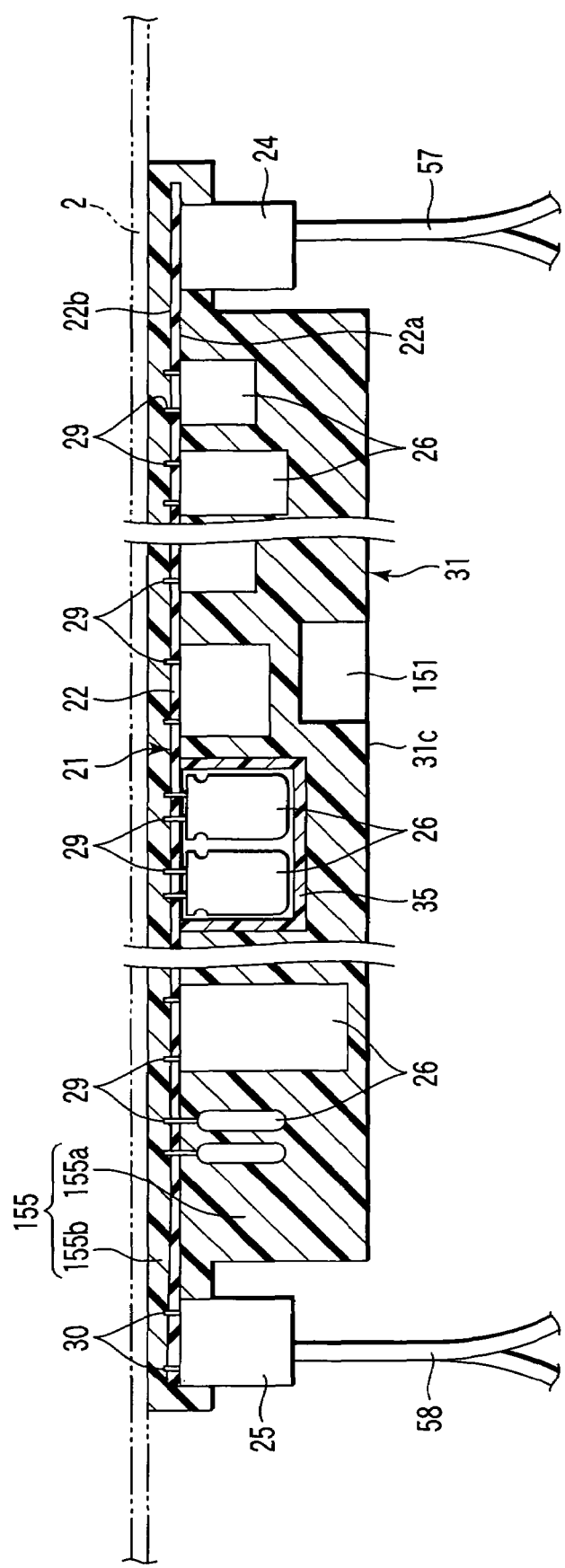
FIG. 39 is a sectional view showing a lighting device of a luminaire according to a seventh embodiment of the present invention.

FIG. 39 shows a seventh embodiment of the present invention. The seventh embodiment is similar to those of the sixth embodiment except for the following. Thus, components identical or functionally similar to those of the sixth embodiment will be denoted by reference numerals similar to those of the sixth embodiment, and description thereof will be omitted.

According to the seventh embodiment, the connector cap used in the sixth embodiment is not used. Insulating covered electric wires 57, 58 are respectively inserted and connected to electric wire connectors 24, 25. During manufacturing, the electric wire connectors 24, 25 are watertightly passed through set holes 63a, 64a of a forming die (see FIGS. 32 and 35).

Components other than the above are similar to those of the sixth embodiment. Thus, the seventh embodiment provides effects similar to those of the sixth embodiment, thereby achieving the object of the present invention.

According to the sixth and seventh embodiments, the fixing means for mounting the waterproof assembly 31 of the lighting device is not limited to the screw. For example, a belt or a clamp may be disposed as fixing means in the chassis 2.

According to the present invention, the circuit module does not need to comprise the electric wire connectors. In this case, it is only necessary to directly connect an insulating covered electric wire to the circuit board by solder or the like. This insulating covered electric wire is drawn through the resin member to the outside of the circuit module.

When the present invention is implemented as an electronic apparatus, the implementation is not limited to the lighting device. For example, the invention can be applied as an electronic apparatus which constitutes an electric circuit of a waterproof type radio. Furthermore, the invention can be applied to a portable electronic apparatus or the like which needs to improve a waterproof function.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. An electronic apparatus comprising:
    a circuit module which comprises a circuit board and a plurality of electric components, which are different in height and mounted on the circuit board;
    a tray, comprising a filling container having an opening edge formed of a side plate, the filling container housing the circuit module and having in part a raised bottom projecting toward a side of the circuit board having the electrical components, the raised bottom being hollow on a side of the tray opposite to a direction in which the raised bottom projects, the raised bottom projecting toward an area of the circuit board in which relatively low electric components are disposed; and
    a filling material having waterproof properties and electric insulation and filling the filling container, the circuit board and the electric components being buried in the filling material.

2. The electronic apparatus according to claim 1, wherein the filling material is made of a synthetic resin mixed with a filler.

3. The electronic apparatus according to claim 1, wherein the raised bottom has a groove which crosses the bottom, and both ends of the groove open at sides of the raised bottom.

4. The electronic apparatus according to claim 1, further comprising a component cap,
    wherein the component cap covers partial electric components among the plurality of electric components, and the partial electric components are isolated from the filling material.

5. The electronic apparatus according to claim 1, wherein the circuit module contains an electric wire connector mounted on the circuit board, and the tray contains a connector cap which covers the electric wire connector.

6. The electronic apparatus according to claim 5, wherein the tray comprises a tray main body having a cap through-hole, and the connector cap, to penetrate the cap through-hole, the connector cap comprises an annular groove in an outer periphery, and a hole edge of the cap through-hole is fitted in the hole edge.

7. The electronic apparatus according to claim 5, wherein the connector cap is fitted over the electric wire connector, and comprises a through-hole schedule section closed by a closing section pushed to be broken by a core wire of an insulating covered electric wire during connection of the electric wire to the electric wire connector.

8. The electronic apparatus according to claim 1, further comprising a shell case having a conductive cover and a housing base connected to the cover, a waterproof assembly including the circuit module, the tray and the filling material is housed in the shell case, the plurality of electric components include electric components having earth terminals, and the earth terminals are electrically connected to the cover by a fixing member.

9. A lighting device formed by using the electronic apparatus of any one of claims 1 to 5 and 8.

* * * * *